(12) United States Patent
Koyama

(10) Patent No.: US 9,217,903 B2
(45) Date of Patent: Dec. 22, 2015

(54) DISPLAY DEVICE

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 473 days.

(21) Appl. No.: 12/972,750

(22) Filed: Dec. 20, 2010

(65) Prior Publication Data
US 2011/0156994 A1    Jun. 30, 2011

(30) Foreign Application Priority Data
Dec. 24, 2009   (JP) .................................. 2009-292851

(51) Int. Cl.
| | | |
|---|---|---|
| *H01L 27/15* | (2006.01) | |
| *G02F 1/1362* | (2006.01) | |
| *H01L 21/02* | (2006.01) | |
| H01L 29/36 | (2006.01) | |
| G02F 1/136 | (2006.01) | |

(52) U.S. Cl.
CPC .... *G02F 1/136286* (2013.01); *H01L 21/02414* (2013.01); *H01L 21/02554* (2013.01); *G02F 2001/13606* (2013.01)

(58) Field of Classification Search
CPC .................. H01L 21/02403; H01L 21/02414; H01L 21/02554; G02F 1/136286; G02F 2001/13606
USPC .......................................... 313/500; 438/549
See application file for complete search history.

(56) References Cited

U.S. PATENT DOCUMENTS

| | | |
|---|---|---|
| 5,453,857 A | 9/1995 | Takahara |
| 5,659,375 A | 8/1997 | Yamashita et al. |
| 5,731,856 A | 3/1998 | Kim et al. |

(Continued)

FOREIGN PATENT DOCUMENTS

| | | |
|---|---|---|
| EP | 1134811 A | 9/2001 |
| EP | 1737044 A | 12/2006 |

(Continued)

OTHER PUBLICATIONS

Osada et al., "15.2: Development of Driver-Integrated Panel using Amorphous In—Ga—Zn—Oxide TFT", SID Digest '09 : SID International Symposium Digest of Technical Papers, May 31, 2009, pp. 184-187.*

(Continued)

*Primary Examiner* — Anh Mai
*Assistant Examiner* — Nathaniel Lee
(74) *Attorney, Agent, or Firm* — Eric J. Robinson; Robinson Intellectual Property Law Office, P.C.

(57) ABSTRACT

To provide a display device which can realize multi-gray scale display by reducing voltage fluctuation of a pixel, a display device includes a plurality of source signal lines, a plurality of gate signal lines which is provided so as to intersect with the source signal lines, and a pixel electrode to which a signal voltage of the source signal line is applied through a transistor including an oxide semiconductor, which is provided near an intersection portion of the source signal line and the gate signal line; in which in the pixel electrode which is provided between a pair of the adjacent source signal lines, edge portions thereof overlap with edge portions of the source signal lines and an overlapped area with one of the source signal lines is substantially equal to an overlapped area with the other source signal line.

29 Claims, 12 Drawing Sheets

(56) References Cited

U.S. PATENT DOCUMENTS

| | | |
|---|---|---|
| 5,744,864 A | 4/1998 | Cillessen et al. |
| 5,903,249 A | 5/1999 | Koyama et al. |
| 6,294,274 B1 | 9/2001 | Kawazoe et al. |
| 6,563,174 B2 | 5/2003 | Kawasaki et al. |
| 6,633,360 B2 | 10/2003 | Okada et al. |
| 6,727,522 B1* | 4/2004 | Kawasaki et al. ............. 257/103 |
| 6,956,633 B2 | 10/2005 | Okada et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,163,848 B2 | 1/2007 | Yamazaki et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,795,621 B2 | 9/2010 | Yamaguchi et al. |
| 8,084,331 B2 | 12/2011 | Ofuji et al. |
| 8,183,099 B2* | 5/2012 | Sakata ............. 438/149 |
| 8,212,248 B2 | 7/2012 | Itagaki et al. |
| 8,242,496 B2 | 8/2012 | Yamazaki et al. |
| 8,445,905 B2 | 5/2013 | Yamazaki et al. |
| 8,513,662 B2 | 8/2013 | Yabuta et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0036815 A1 | 2/2004 | Kim et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1* | 3/2007 | Akimoto et al. ............. 438/795 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1* | 8/2007 | Hirao et al. ............. 257/43 |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0079005 A1* | 4/2008 | Tseng ............. 257/72 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0225195 A1* | 9/2008 | Oohara et al. ............. 349/46 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051937 A1 | 3/2010 | Kaji et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0155718 A1* | 6/2010 | Kirita et al. ............. 257/43 |
| 2011/0062433 A1 | 3/2011 | Yamazaki |

FOREIGN PATENT DOCUMENTS

| | | |
|---|---|---|
| EP | 1746659 A | 1/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-230422 A | 8/1994 |
| JP | 06230422 A * | 8/1994 |
| JP | 06-274130 A | 9/1994 |
| JP | 08-062582 A | 3/1996 |
| JP | 08-110530 | 4/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-281682 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-242987 A | 9/2006 |
| JP | 2008-060419 A | 3/2008 |
| JP | 2008-218495 A | 9/2008 |
| JP | 2009-164393 A | 7/2009 |
| JP | 2009-212443 A | 9/2009 |
| JP | 2009-276387 A | 11/2009 |
| TW | 200950120 | 12/2009 |
| WO | WO-2004/114391 | 12/2004 |
| WO | WO-2006/093028 | 9/2006 |
| WO | WO-2008/105250 | 9/2008 |
| WO | WO-2009/087943 | 7/2009 |

(56) References Cited

FOREIGN PATENT DOCUMENTS

| WO | WO-2009/110623 | 9/2009 |
|---|---|---|
| WO | WO 2009110623 A1 * | 9/2009 |
| WO | WO-2009/139483 | 11/2009 |

OTHER PUBLICATIONS

Osada et al., "15.2: Development of Driver-Integrated panel using Amorphous In—Ga—Zn—Oxide TFT", SID Digest '09: SID International Symposium of Technical Papers, May 31, 2009, pp. 184-187.*

International Search Report (Application No. PCT/JP2010/071522) Dated Jan. 11, 2011.

Written Opinion (Application No. PCT/JP2010/071522) Dated Jan. 11, 2011.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Taiwanese Office Action (Application No. 099141730) Dated Mar. 26, 2015.

* cited by examiner

DISPLAY DEVICE

TECHNICAL FIELD

The technical field of the present invention relates to a display device, in particular, a display device which can realize multi-gray scale display.

BACKGROUND ART

Display devices which are driven with transistors including amorphous silicon or polysilicon have been mainly used. However, it has been difficult to realize multi-gray scale display in these display devices due to the effect of the off-state current of the transistors.

As an example of a pixel in a display device, FIG. 12 illustrates a pixel including a transistor 100, a liquid crystal element 110, and a storage capacitor 120. The transistor 100 is an amorphous silicon transistor or a polysilicon transistor. In each pixel, image data is written into the liquid crystal element 110 and the storage capacitor 120 from the transistor 100, so that the liquid crystal element 110 is provided with an electric filed; accordingly, an image can be displayed.

However, the electric charges accumulated in the liquid crystal element 110 and the storage capacitor 120 are discharged due to the off-state current of the transistor 100, and the voltage of the pixel is accordingly fluctuated.

In each pixel, a storage capacitor C, a voltage fluctuation V, an off-state current i, and a holding time T satisfies the relation of CV=iT. Therefore, in the case where the off-state current i of the transistor 100 is set to 0.1 [pA], the electrostatic capacitance C of the storage capacitor 120 is set to 0.1 [pF], and one frame period T is set to 16.6 [ms], the voltage fluctuation V of a pixel in one frame period is 16.6 [mV] because the product of the electrostatic capacitance and the voltage fluctuation is equal to the product of the off-state current and the holding time.

It is assumed that the display device has 256 ($=2^8$) gray scales and the maximum driving voltage of the liquid crystal element of a pixel is 5 [V]. In this case, the grayscale voltage for 1 gray scale is approximately 20 [mV]. In other words, the voltage fluctuation V of the pixel=16.6 [mV] which is obtained in the above calculation corresponds to the fluctuation of the grayscale voltage for approximately 1 gray scale. Further, it is assumed that the display device has 1024 ($=2^{10}$) gray scales. In this case, the grayscale voltage for 1 gray scale is approximately 5 [mV]. Therefore, the voltge fluctuation V of the pixel=16.6 [mV] corresponds to the fluctuation of approximately 4 gray scales and thus the effect of voltage fluctuation due to the off-state current cannot be ignored.

In Patent Document 1, a display device including a polysilicon transistor has been proposed.

REFERENCE

Patent Document

[Patent Document 1] Japanese Published Patent Application No. H8-110530

DISCLOSURE OF INVENTION

It is an object of the present invention to provide a display device which can realize multi-gray scale display by reducing voltage fluctuation of a pixel.

According to one embodiment of the present invention, a display device includes a plurality of source signal lines, a plurality of gate signal lines which is provided so as to intersect with the source signal lines, and a pixel electrode to which a signal voltage of the source signal line is applied through a transistor including an oxide semiconductor, which is provided near an intersection portion of the source signal line and the gate signal line; in which in the pixel electrode which is provided between a pair of the adjacent source signal lines, edge portions thereof overlap with edge portions of the source signal lines and an overlapped area with one of the source signal lines is substantially equal to an overlapped area with the other source signal line.

The oxide semiconductor is intrinsic or substantially intrinsic, and an off-state current per unit channel width of the transistor is 100 aA/μm or less ("a" represents $10^{-18}$), preferably 1 aA/μm or less, and more preferably 1 zA/μm or less ("z" represents $10^{-21}$). Note that in this specification, the term of "intrinsic" refers to a state of a semiconductor where the carrier concentration is less than $1 \times 10^{12}/cm^3$, and the state of "substantially intrinsic" refers to a state of a semiconductor where the carrier concentration is greater than or equal to $1 \times 10^{12}/cm^3$ and less than $1 \times 10^{14}/cm^3$.

Multi-gray scale display can be realized by reducing voltage fluctuation of a pixel. Further, display device having high-quality display can be provided in which crosstalk or the like is suppressed by reducing the effect of parasitic capacitance between a signal line and a pixel electrode.

BEST MODE FOR CARRYING OUT THE INVENTION

Embodiments of the invention disclosed herein will be described below with reference to the drawings. Note that the invention is not limited to the following description, and those skilled in the art can easily understand that modes and details of the invention can be changed in various ways without departing from the purpose and the scope of the invention.

Therefore, it should be noted that the invention should not be interpreted as being limited to the following description of the embodiments.

Embodiment 1

Figure 1:
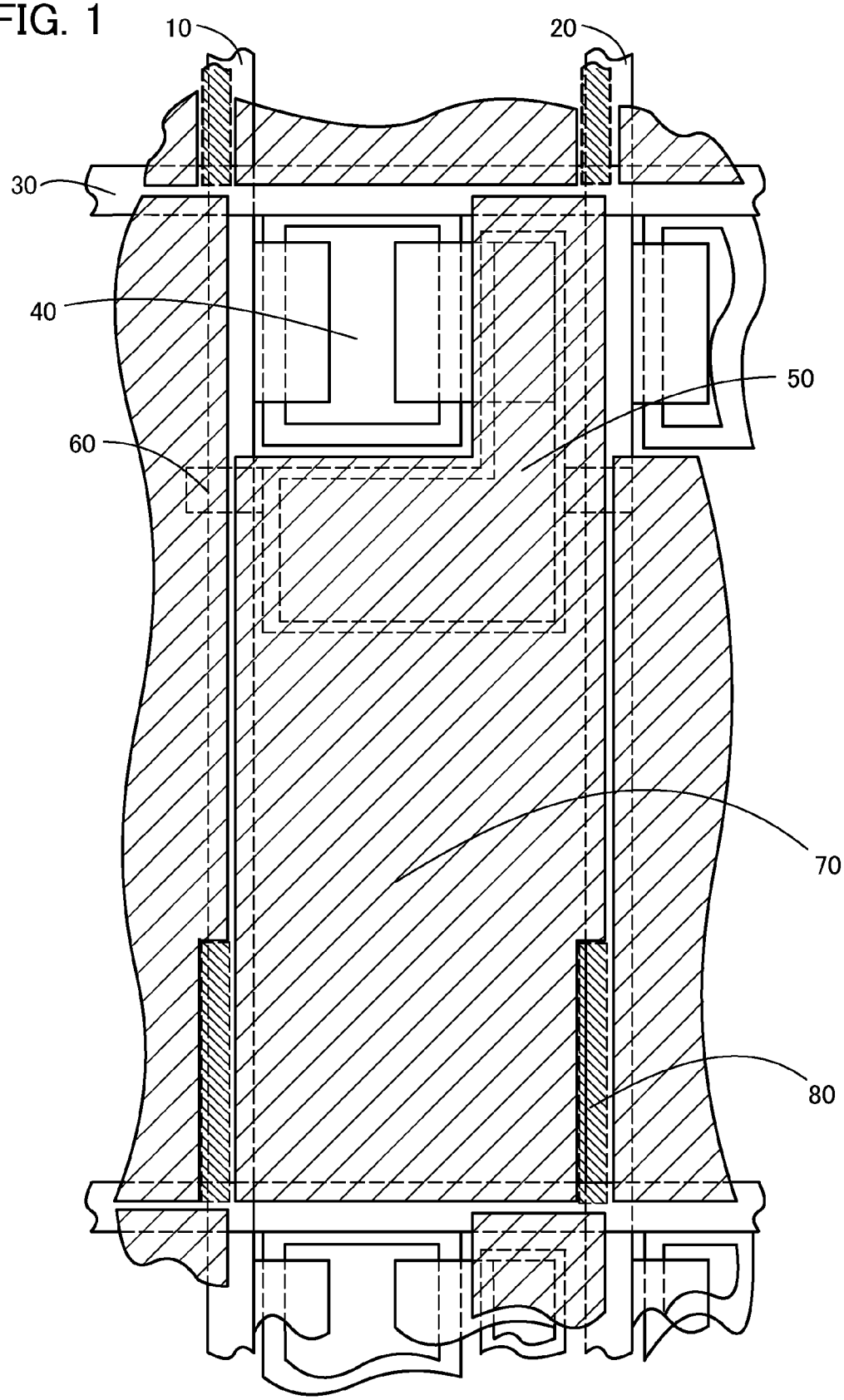
FIG. 1 is a plan view illustrating a structural example of a display device.

FIG. 1 is a plan view illustrating a structural example of a pixel in a display device. The display device includes source signal lines 10 and 20, a gate signal line 30, a transistor 40, a storage capacitor 50, a capacitor line 60, and a pixel electrode 70.

In the display device, a plurality of signal lines including the signal lines 10 and 20 are provided. In addition, a plurality of gate signal lines including the gate signal line 30 are provided in matrix with respect to the source signal lines.

The transistor 40 serving as a switching element is provided near an intersection portion of the source signal line 10 and the gate signal line 30. The storage capacitor 50 and the capacitor line 60 are provided adjacent to the transistor 40.

The pixel electrode 70 is formed so that the edge portions thereof overlap with the edge portions of a pair of the adjacent source signal lines 10 and 20 and the edge portions of a pair of the adjacent gate signal lines 30.

The transistor 40 is a transistor including an oxide semiconductor. The off-state current of the transistor 40 can be set to 100 [aA] or less, preferably 1 [aA] or less, and more preferably 10 [zA] or less by using intrinsic or substantially intrinsic oxide semiconductor. Note that the above values are obtained in the case where the channel width W of the transistor 40 is set to 1 [μm] and measurement is performed at room temperature.

In the pixel of the display device, which is illustrated in FIG. 1, an off-state current i of the transistor 40, an electrostatic capacitance C of the storage capacitor 50, a voltage fluctuation V, and a holding time T satisfies the relation of $CV=iT$. Therefore, the voltage fluctuation V when the transistor 40 is off can be reduced by decreasing the off-state current i of the transistor 40.

Specifically, in the case where the off-state current i of the transistor 40 is 1 [aA], the electrostatic capacitance C of the storage capacitor 50 is 0.1 [pF], and one frame period T is 16.6 [ms], the voltage fluctuation V of the pixel due to the off-state current of the transistor 40 is $16.6 \times 10^{-5}$ [mV] because the product of the electrostatic capacitance and the voltage fluctuation is equal to the product of the off-state current and the holding time.

It is assumed that the display device has 256 ($=2^8$) gray scales and the maximum driving voltage of a liquid crystal element of the pixel is 5 [V]. In this case, the grayscale voltage for 1 gray scale is approximately 20 [mV]. In other words, the voltage fluctuation V of the pixel=$16.6 \times 10^{-5}$ [mV] which is obtained here is extremely small for the grayscale voltage for approximately 1 gray scale.

In addition, even in the case where the gray scale level of the display device is further increased, the voltage fluctuation V of the pixel is extremely small as compared to the grayscale voltage. In other words, the voltage fluctuation of the pixel due to the off-state current of the transistor 40 can be considered substantially zero.

Subsequently, the voltage fluctuation V of the pixel due to leakage current of the liquid crystal element in the display device is considered. In general, the leakage current of a liquid crystal element is approximately 1 [fA]; therefore, the voltage fluctuation V is calculated to be 0.166 [mV] with this value. This value means that the voltage fluctuation V is adversely affected when the gray scale level of the display device reaches up to approximately 30000 gray scales. Therefore, the leakage current does not cause any problem in a normal liquid crystal element.

Since the pixel electrode in the display device overlaps with the signal lines such as the source signal line and the gate signal line, parasitic capacitance is generated between the pixel electrode and these signal lines and thus, in some cases, the potential of the pixel electrode varies due to capacitance coupling by the parasitic capacitance.

In general, as the positional relation of a pixel electrode, a source signal line, and a gate signal line in a display device, the gate signal line, the source signal line, and the pixel electrode are provided in this order over a substrate. Therefore, the distance between the source signal line and the pixel electrode is shorter than the distance between the gate signal line and the pixel electrode. Moreover, the shape of the pixel is a rectangle having a length in the direction of the source signal line; therefore, the area of the pixel electrode overlapping with the source signal line is larger than the area of the pixel electrode overlapping with the gate signal line. Consequently, the parasitic capacitance between the source signal line and the pixel electrode is larger than the parasitic capacitance between the gate signal line and the pixel electrode. Thus, as for the effect of the parasitic capacitance, the parasitic capacitance generated between the source signal line and the pixel electrode may be considered.

An AC driving in which AC voltage is applied for driving is performed in a display device including a liquid crystal element in order to prevent deterioration of a liquid crystal material. FIGS. 2A to 2D are schematic views each illustrating an inversion mode of a pixel. Each of the inversion modes illustrated in FIGS. 2A to 2D operates so that the states shown in the right and the left are inverted.

Figure 2A:
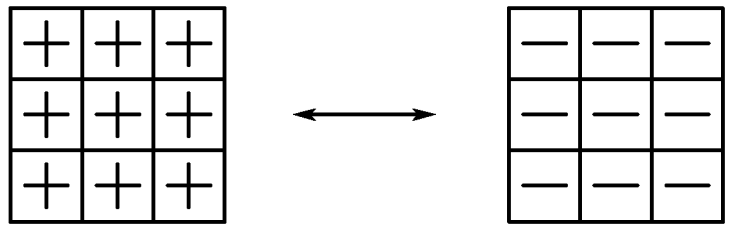
FIGS. 2A to 2D are schematic views each illustrating an inversion mode of a pixel.
Figure 2B:
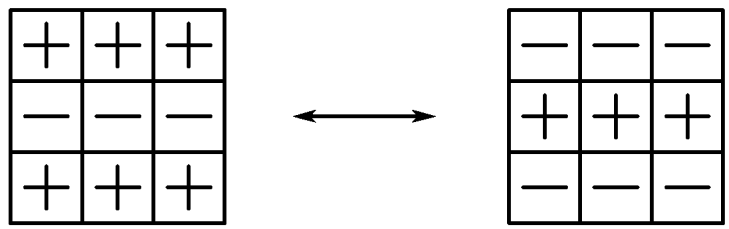
Figure 2C:
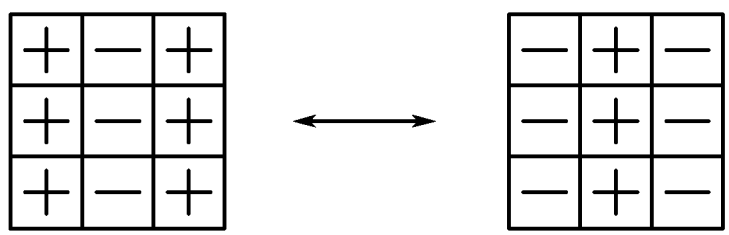
Figure 2D:
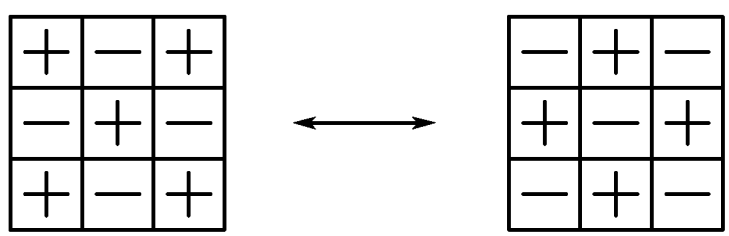

FIG. 2A illustrates a frame inversion driving mode. In the frame inversion driving mode, all sub-pixels in each frame are inverted. Note that the frame inversion driving method is not used in general because of flickers. FIG. 2B illustrates a gate-line inversion driving mode. In the gate-line inversion driving mode, in each frame, all positive electrodes and negative electrodes in sub-pixels in a row direction are inverted. FIG. 2C illustrates a source-line inversion driving mode. In the source-line inversion driving mode, in each frame, all positive electrodes and negative electrodes in sub-pixels in a column direction are inverted. FIG. 2D illustrates a dot inversion driving mode. In the dot inversion driving mode, in each frame, all positive electrodes and negative electrodes in alternate sub-pixels are inverted.

In the pixel illustrated in FIG. 1, parasitic capacitance is generated by overlap of the source signal lines 10 and 20 and the pixel electrode 70. When the gate-line inversion driving mode or the dot inversion driving mode is employed, data is inverted in every gate signal lines 30; therefore, signals inputted into the source signal lines 10 and 20 are inverted in every gate line period (approximately 30 μs). Accordingly, although the pixel electrode 70 is affected by the parasitic capacitance, the affect is not recognized by human eyes because of high frequency.

On the other hand, in the case of the source-line inversion driving mode, the signals inputted into the source signal lines 10 and 20 are inverted in every frame period (approximately 16 ms). Accordingly, the pixel electrode 70 is affected by the parasitic capacitance in such a degree that the affect is recognized by human eyes.

The description below will be made with the premise of the source-line inversion driving mode.

Figure 5:
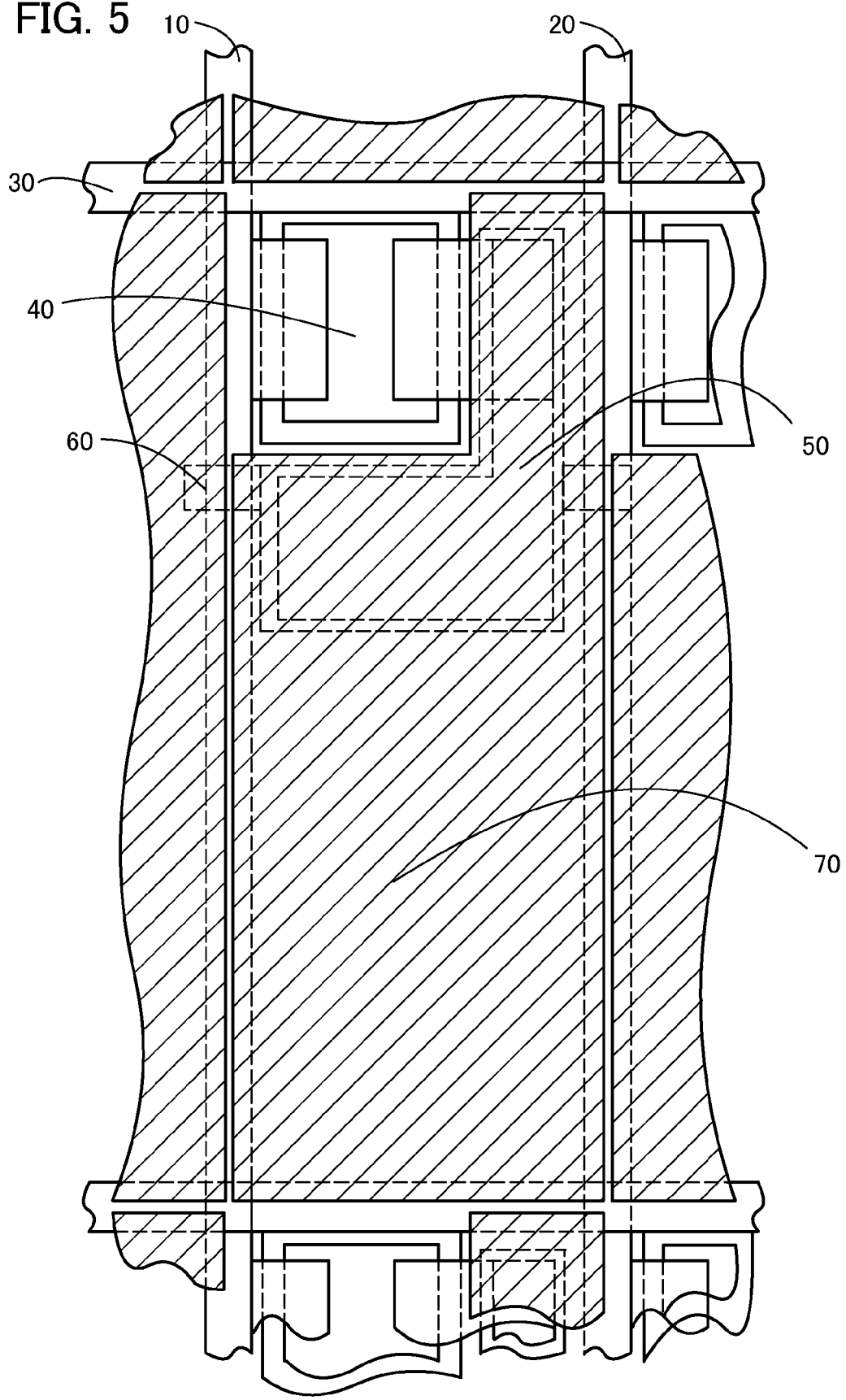
FIG. 5 is a plan view illustrating a structural example of a display device.

In a plan view of a pixel illustrated in FIG. 5, a pixel electrode 70 and a source signal line 10 does not overlap with each other near a transistor 40. Consequently, the area of the pixel electrode 70 overlapping with a source signal line 20 is larger than the area of the pixel electrode 70 overlapping with the source signal line 10. In other words, the parasitic capacitance between the source signal line 20 and the pixel electrode 70 is larger than the parasitic capacitance between the source signal line 10 and the pixel electrode 70.

Figure 3:
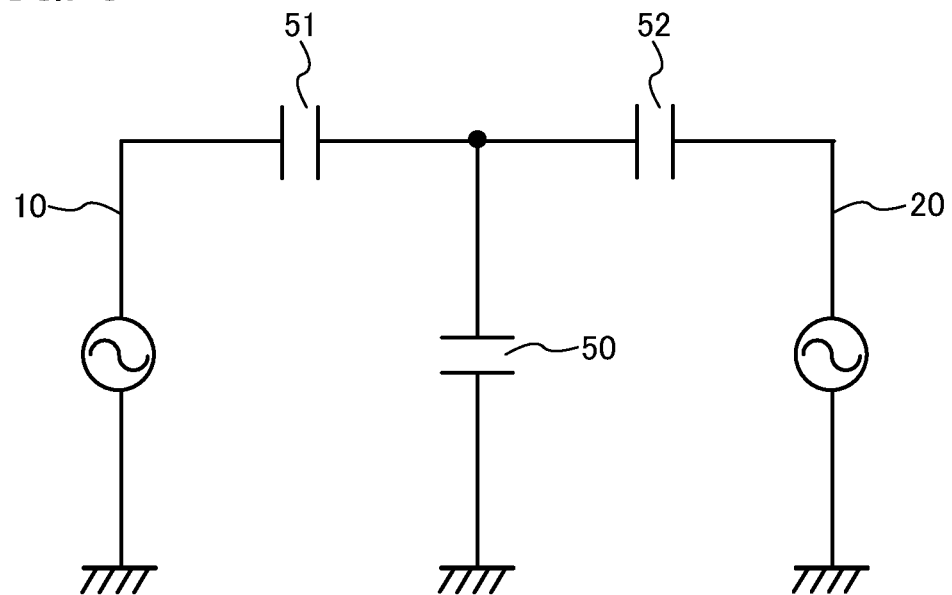
FIG. 3 is a circuit diagram illustrating parasitic capacitance which is generated by overlap of source signal lines 10 and 20 and a pixel electrode 70.

FIG. 3 is a circuit diagram illustrating parasitic capacitance which is generated by overlap of the source signal lines 10 and 20 and the pixel electrode 70. In FIG. 3, a parasitic capacitance 51 represents the parasitic capacitance which is generated by overlap of the source signal line 10 and the pixel electrode 70. In addition, a parasitic capacitance 52 represents the parasitic capacitance which is generated by overlap of the source signal line 20 and the pixel electrode 70.

In FIG. 3, the capacitance value of a storage capacitor 50 is denoted by $C_{50}$; the capacitance value of the parasitic capacitance 51, $C_{51}$; and the capacitance value of the parasitic capacitance 52, $C_{52}$. In addition, the amplitude of the source signal line 10 is denoted by $V_{10}$, and the amplitude of the source signal line 20 is denoted by $V_{20}$. In this case, the value of the amplitude $\Delta V$ that occurs in the pixel electrode 70 is expressed in Formula (1).

[FORMULA 1]

$$\Delta V = \frac{C_{51}}{C_{50} + C_{51} + C_{52}} V_{10} - \frac{C_{52}}{C_{50} + C_{51} + C_{52}} V_{20} \quad (1)$$

Here, as long as the amplitude of the source signal line 10 and the amplitude of the source signal line 20 are equal to be $V_{10}=V_{20}$, the Formula (1) can be altered to Formula (2).

[FORMULA 2]

$$\Delta V = (C_{51} - C_{52}) \frac{V_{10}}{C_{50} + C_{51} + C_{52}} \quad (2)$$

According to Formula (2), as long as the capacitance value of the parasitic capacitance 51 and the capacitance value of the parasitic capacitance 52 are equal to be $C_{51}=C_{52}$, the amplitude $\Delta V$ that occurs in the pixel electrode 70 is 0. Therefore, the drop in gray scale due to the amplitude $\Delta V$ that occurs in the pixel electrode 70 can be prevented; therefore, multi-gray scale display can be realized.

In order to equalize the capacitance value of the parasitic capacitance 51 and the capacitance value of the parasitic capacitance 52, in FIG. 1, a region 80 in the pixel electrode 70 overlapping with the source signal line 20 is shaved so that the overlapped area is adjusted, i.e. the area of the pixel electrode 70 overlapping with the source signal line 10 and the area of the pixel electrode 70 overlapping with the source signal line 20 become equal. Note that these areas are not necessarily strictly the same. For example, a difference in area of about 10% is acceptable. A difference within 5% is more preferable.

Accordingly, the parasitic capacitance which is generated by overlap of the source signal line 10 and the pixel electrode 70 and the parasitic capacitance which is generated by overlap of the source signal line 20 and the pixel electrode 70 become equal. As a result, display defect such as crosstalk can be prevented.

Figure 4:
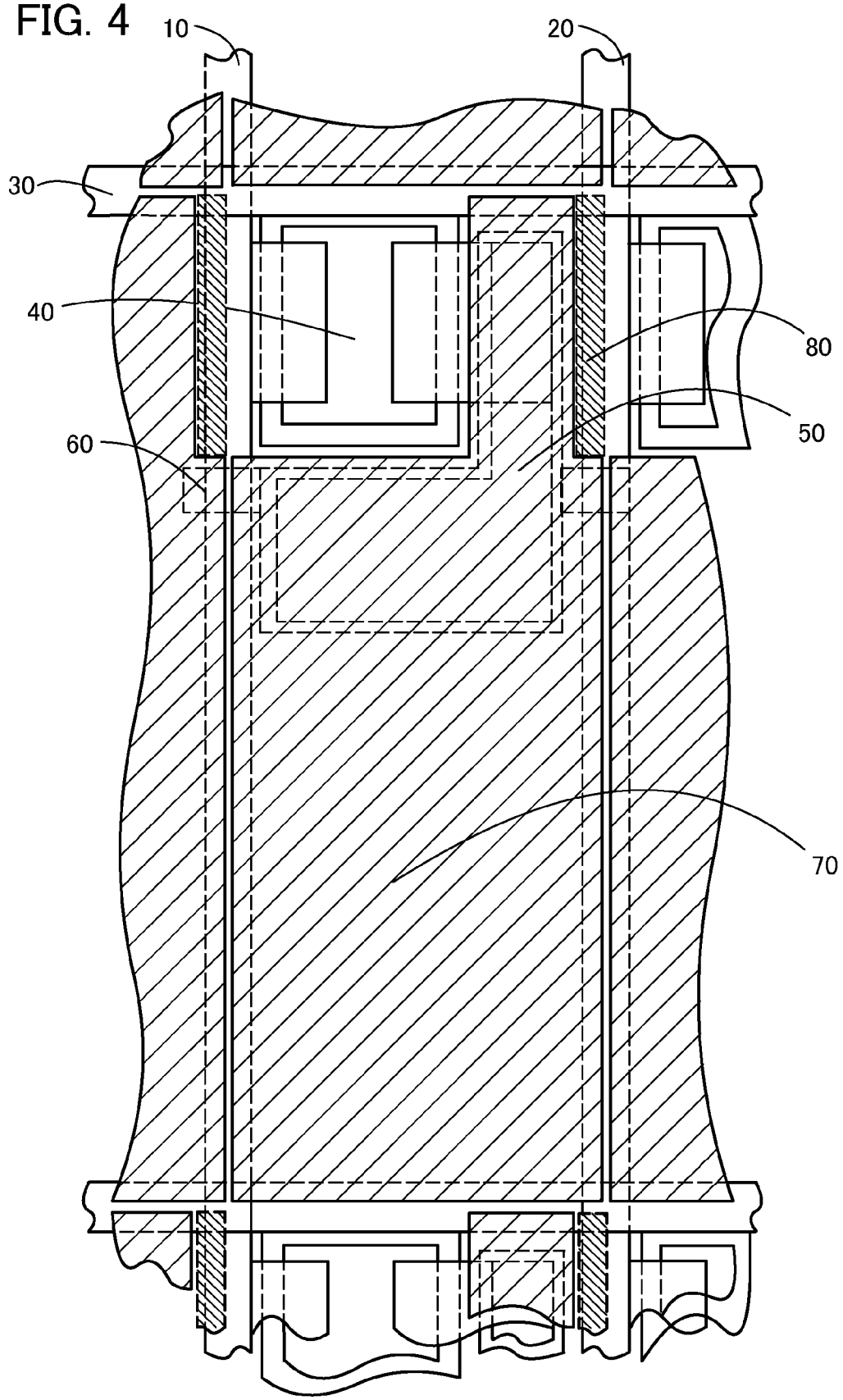
FIG. 4 is a plan view illustrating a structural example of a display device.

When the area of the pixel electrode 70 overlapping with the source signal line 10 and the area of the pixel electrode 70 overlapping with the source signal line 20 become equal, the position of the region 80 is not limited to that illustrated in FIG. 1. For example, the positions may be those illustrated in FIG. 4. In order to equalize the area of the pixel electrode 70 overlapping with the source signal line 10 and the area of the pixel electrode 70 overlapping with the source signal line 20, a plurality of regions 80 may be formed. In particular, with the position of the region 80, which is illustrated in FIG. 1, the position is symmetric with respect to the position where the source signal line 10 and the pixel electrode 70 do not overlap with each other; therefore, display unevenness or the like can be effectively prevented.

Next, an oxide semiconductor which is used for the transistor 40 is described in detail.

Impurities such as hydrogen, moisture, hydroxyl, or hydroxide (also referred to as a hydrogen compound) which are thought to act as donors are intentionally removed from the oxide semiconductor which is used for the transistor 40, and then oxygen which is simultaneously reduced in the step of removing these impurities is supplied to the oxide semiconductor which is used for the transistor 40. Therefore, the oxide semiconductor which is used for the transistor 40 is highly purified and becomes electrically i-type (intrinsic). This is in order to suppress the fluctuations of electric characteristics of the transistor 40.

Hydrogen contained in the oxide semiconductor is removed as much as possible; thus, the carrier density of the oxide semiconductor is less than $1 \times 10^{14}/cm^3$, preferably less than $1 \times 10^{12}/cm^3$, and more preferably less than $1 \times 10^{10}/cm^3$.

In an oxide semiconductor which is a wide band gap semiconductor, the density of the minority carrier is low and the minority carrier is difficult to be induced. Thus, it can be said that, in the transistor including an oxide semiconductor, tunnel current is difficult to be generated; consequently, off-state current is difficult to flow.

Additionally, since an oxide semiconductor is a wide band gap semiconductor, impact ionization and avalanche breakdown are difficult to occur in the transistor including an oxide semiconductor. Therefore, it can be said that the transistor including an oxide semiconductor has resistance to hot carrier deterioration. This is because hot carrier deterioration is mainly caused by an increase in the number of carriers due to avalanche breakdown and by injection of the carriers accelerated to high speed to the gate insulating film.

Note that in this specification, an off-state current refers to a current that flows between a source and a drain of an n-channel transistor whose threshold voltage $V_{th}$ is positive when an arbitrary gate voltage in the range of −20 [V] to −5 [V] inclusive is applied at room temperature. Note that the room temperature refers to a temperature of 15° C. to 25° C. inclusive.

In the transistor 40 including an oxide semiconductor which is disclosed in this specification, an off-state current value per channel width W=1 [μm] is 100 [aA/μm] or less, preferably 1 [aA/μm] or less, and more preferably 10 [zA/μm] or less at room temperature.

As described above, a transistor whose off-state current value is extremely small can be provided with the use of an oxide semiconductor which is highly purified and becomes electrically i-type (intrinsic). Measurement results of off-state current characteristics which are obtained by manufacturing an evaluation element (also referred to as TEG) are described below.

As the TEG which is manufactured, 200 transistors each having L/W=3 [μm]/50 [μm] (film thickness d: 30 [nm]) are connected in parallel, so that a transistor having L/W=3 [μm]/10000 [μm] is provided.

Figure 11:
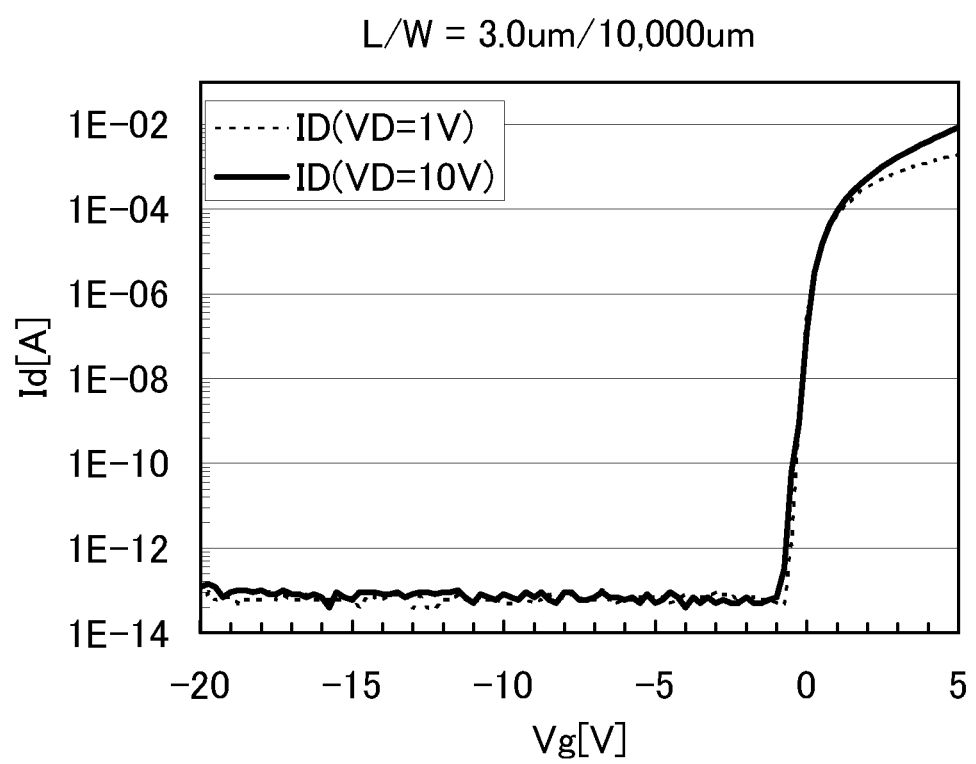
FIG. 11 is a graph showing electric characteristics of a transistor.
Figure 12:
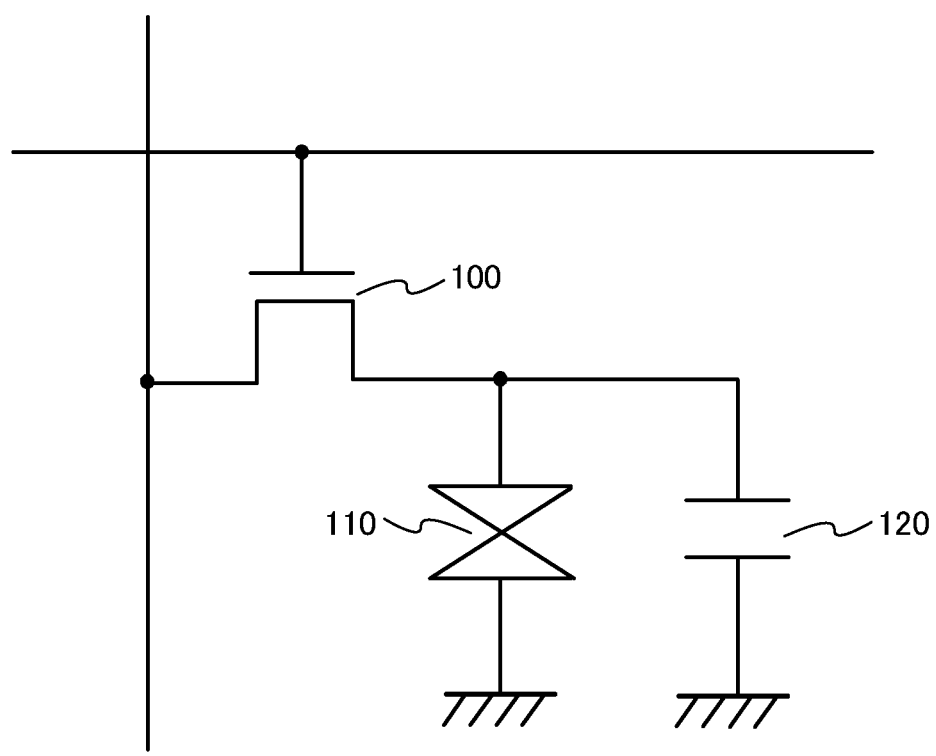
FIG. 12 is a circuit diagram illustrating a configuration example of a pixel.

FIG. 11 is a graph showing a conduction property [log $(I_d)$-$V_g$] of the transistor provided for the TEG. In the graph, the horizontal axis represents the level of gate voltage $V_g$ [V], and the vertical axis represents the amount of drain current $I_d$ [A]. Note that the substrate temperature is room temperature, and a voltage $V_d$ between a source and a drain is either 1 [V] (a dashed line in the graph) or 10 [V] (a solid line in the graph). At this time, transfer characteristics of source-drain current $I_d$ were measured by changing voltages $V_g$ between the source and a gate from −20 [V] to +5 [V].

As shown in FIG. 11, in the transistor whose channel width W is 10000 [μm], an off-state current is $1 \times 10^{-13}$ [A] or less when $V_d$ is either 1 [V] or 10 [V]. This is less than or equal to the resolution (100 fA) of a measurement device (a semiconductor parameter analyzer, Agilent 4156C manufactured by Agilent Technologies Inc.). This off-state current value per channel width 1 [μm] corresponds to 10 [aA/μm].

Embodiment 2

In this embodiment, an example of a structure of a transistor including an intrinsic or substantially intrinsic oxide semiconductor and an example of a manufacturing method thereof will be described.

Figure 6A:
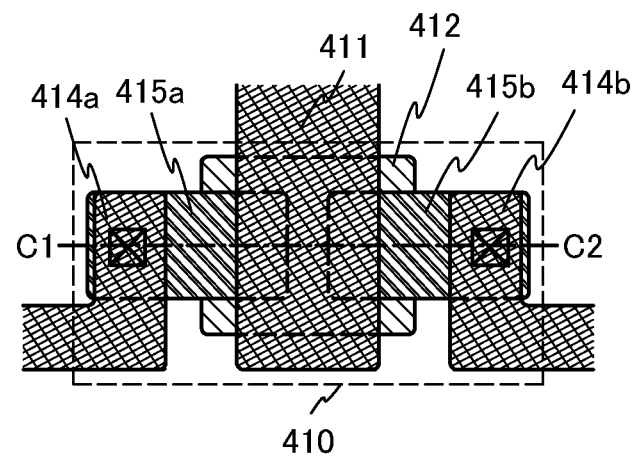
FIGS. 6A and 6B each illustrate a structural example of a transistor.
Figure 6B:
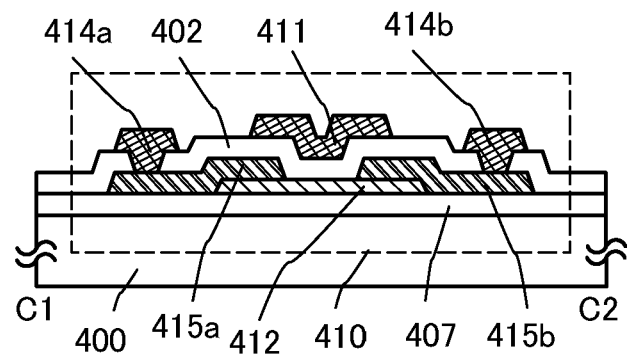

An example of a plan structure and an example of a cross-sectional structure of a transistor are respectively illustrated in FIGS. 6A and 6B. FIG. 6A is a plan view of a top-gate transistor, and FIG. 6B is a cross-sectional view taken along line C1-C2 of FIG. 6A.

A transistor 410 includes, over a substrate 400, an insulating layer 407, an oxide semiconductor layer 412, a first electrode (one of a source electrode and a drain electrode) 415a, a second electrode (the other of the source electrode and the drain electrode) 415b, a gate insulating layer 402, and a gate electrode 411. A first wiring layer 414a and a second wiring layer 414b are provided in contact with and electrically connected to the first electrode 415a and the second electrode 415b, respectively.

Note that although the transistor 410 in FIG. 6A has a single-gate structure, the present invention is not limited to this structure. The transistor may have a multi-gate structure which includes a plurality of gate electrodes and a plurality of channel formation regions.

Next, a manufacturing method of the transistor 410 will be described with reference to FIGS. 7A to 7E.

First, the insulating layer 407 serving as a base film is formed over the substrate 400.

It is necessary that the substrate 400 have at least heat resistance high enough to withstand heat treatment performed later. When the temperature of the heat treatment performed later is high, a substrate having a strain point of 730° C. or higher is preferably used.

As the insulating layer 407, an oxide insulating layer such as a silicon oxide layer, a silicon oxynitride layer, an aluminum oxide layer, or an aluminum oxynitride layer is used. The insulating layer 407 can be formed with a plasma CVD method, a sputtering method, or the like. In order to prevent the insulating layer 407 from containing a large amount of hydrogen, the insulating layer 407 is preferably formed with a sputtering method. In this embodiment, a silicon oxide layer is formed as the insulating layer 407 with a sputtering method. Specifically, the substrate 400 is transferred to a process chamber and a sputtering gas which contains high-purity oxygen and from which hydrogen and moisture have been removed is introduced, and a target of silicon or silicon oxide is used, whereby a silicon oxide layer is formed as the insulating layer 407 over the substrate 400. Note that the substrate 400 may be kept at room temperature or may be heated during film formation.

A specific example of a film formation condition for a silicon oxide film is as follows: quartz (preferably, synthetic quartz) is used as the target; the substrate temperature is 108° C.; the distance between a target and the substrate 400 (T-S distance) is 60 mm; the pressure is 0.4 Pa; the high-frequency power source is 1.5 kW; the atmosphere is a mixed atmosphere of oxygen and argon (the flow rate ratio of oxygen to argon is 25 sccm: 25 sccm); and an RF sputtering method is used. The thickness of the silicon oxide film is 100 nm Note that a silicon target may be used as the target instead of the quartz (preferably, synthetic quartz) target. Further, an oxygen gas may be used as a sputtering gas instead of a mixed gas of oxygen and argon. Here, a sputtering gas for forming the insulating layer 407 is a high-purity gas in which impurities such as hydrogen, water, hydroxyl, or hydride are reduced to such a level that the concentration thereof can be expressed by ppm, preferably ppb.

In addition, it is preferable that hydrogen, water, hydroxyl, hydroxide, or the like be not contained in the insulating layer 407 by forming the insulating layer 407 while moisture remaining in the process chamber is removed.

In order to remove moisture remaining in the process chamber, an entrapment vacuum pump may be used. For example, a cryopump, an ion pump, or a titanium sublimation pump can be used. Further, as an evacuation unit, a turbo pump provided with a cold trap is preferably used in combination. A film formation chamber which is evacuated with a cryopump is preferable because a hydrogen atom, a compound including a hydrogen atom such as water ($H_2O$), or the like is removed from the chamber and thus hydrogen atoms are hardly included in the insulating layer 407 formed in the film formation chamber.

Examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Further, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a film formation method using a sputtering method, there are also a reactive sputtering method in which a target substance and a sputtering gas component are chemically reacted with each other during the film formation to form a thin compound film thereof, and a bias sputtering method in which voltage is also applied to a substrate during the film formation.

The structure of the insulating layer 407 is not limited to a single-layer structure and may be a stacked structure. For example, a nitride insulating layer such as a silicon nitride layer, a silicon nitride oxide layer, an aluminum nitride layer, or an aluminum nitride oxide layer and the above-described oxide insulating layer may be stacked in this order over the substrate 400.

For example, a silicon nitride layer is formed using a silicon target by introducing a sputtering gas which contains high-purity nitrogen and from which hydrogen and moisture have been removed, to a space between the silicon oxide layer and the substrate. In this case, the silicon nitride layer is preferably formed while moisture remaining in a process chamber is removed, similarly to the silicon oxide layer. In the formation of the silicon nitride layer, the substrate may also be heated during the film formation.

Next, an oxide semiconductor layer is formed over the insulating layer 407 with a sputtering method. Note that the substrate 400 over which the insulating layer 407 has been formed is preferably preheated before the formation of the oxide semiconductor layer. Through this preheating, impurities such as hydrogen or moisture adsorbed on the substrate 400 are eliminated and removed. This is in order to prevent the oxide semiconductor layer from containing hydrogen, moisture, and hydroxyl as much as possible.

Note that before the formation of the oxide semiconductor layer with a sputtering method, dust attached to a surface of the insulating layer 407 is preferably removed by reverse sputtering. The reverse sputtering refers to a method in which a high-frequency power source is used for application of voltage to a substrate side under an argon atmosphere in order to generate plasma in the vicinity of the substrate to modify a surface. At that time, voltage is not applied to a target side.

As a target for forming an oxide semiconductor, a metal oxide target containing zinc oxide as its main component can be used. For example, a target having a composition ratio of $In_2O_3:Ga_2O_3:ZnO=1:1:1$ [molar ratio] or the like can be used. Alternatively, a metal oxide target having a composition ratio of $In_2O_3:Ga_2O_3:ZnO=1:1:2$ [molar ratio] or $In_2O_3:Ga_2O_3:ZnO=1:1:4$ [molar ratio] can be used. Further, a metal oxide target which includes $SiO_2$ at 2 wt % to 10 wt % inclusive can be used. The fill rate of the oxide semiconductor target may be 90% to 100% inclusive, preferably 95% to 99.9% inclusive. With the use of the oxide semiconductor target with a high filling factor, the formed oxide semiconductor layer can have high density.

Note that the oxide semiconductor layer may be formed under a rare gas (typically, argon) atmosphere, an oxygen atmosphere, or a mixed atmosphere of a rare gas and oxygen. For film formation of the oxide semiconductor layer, a high-purity gas in which impurities such as hydrogen, water, hydroxyl, or hydride are reduced to such a level that the concentration thereof can be expressed by ppm, preferably ppb, is used as a sputtering gas.

The substrate 400 is held in a process chamber where remaining moisture is removed and which is kept under reduced pressure, and the oxide semiconductor layer is formed over the substrate 400 with the use of a metal oxide as a target. At the time of the film formation, a sputtering gas from which hydrogen and moisture are removed is introduced as a sputtering gas. In order to remove moisture remaining in the process chamber, an entrapment vacuum pump is preferably used. For example, a cryopump, an ion pump, or a titanium sublimation pump is preferably used. The evacuation unit may be a turbo pump provided with a cold trap. In the film formation chamber which is evacuated with the cryopump, a hydrogen atom, a compound containing a hydrogen atom, such as water ($H_2O$), (more preferably, also a compound containing a carbon atom), or the like is removed, whereby the concentration of an impurity contained in the oxide semiconductor layer formed in the film formation chamber can be reduced. Further, the substrate temperature may be kept at room temperature or may be increased to a temperature lower than 400° C. during the film formation of the oxide semiconductor layer.

An example of the film formation condition for the oxide semiconductor layer is as follows: the temperature of the substrate is room temperature; the distance between the substrate and the target is 110 mm; the pressure is 0.4 Pa; the direct current (DC) power source is 0.5 kW; and the atmosphere is a mixed atmosphere of oxygen and argon (the flow rate ratio of oxygen to argon is 15 sccm: 30 sccm). Note that a pulse direct current (DC) power source is preferable because dust can be reduced and the film thickness can be uniform. The thickness of the oxide semiconductor layer is preferably 2 nm to 200 nm inclusive, preferably 5 nm to 30 nm inclusive. Note that an appropriate thickness of the oxide semiconductor layer varies depending on an oxide semiconductor material; therefore, the thickness may be determined as appropriate depending on the material.

Although an In—Ga—Zn—O-based oxide that is ternary metal oxide is used as the oxide semiconductor in the given example, the following oxide semiconductors can also be used: In—Sn—Ga—Zn—O that is quaternary metal oxide; In—Sn—Zn—O, In—Al—Zn—O, Sn—Ga—Zn—O, Al—Ga—Zn—O, or Sn—Al—Zn—O that is ternary metal oxide; In—Zn—O, Sn—Zn—O, Al—Zn—O, Zn—Mg—O, Sn—Mg—O, or In—Mg—O that is binary metal oxide; In—O; Sn—O; Zn—O; and the like. The above oxide semiconductor may contain silicon. These oxide semiconductor layers may be amorphous or crystalline. Further, these oxide semiconductor layers may be non-single-crystal or single crystal.

Note that as the oxide semiconductor layer, a thin film expressed by $InMO_3(ZnO)_m$ (m>0) can also be used. Here, M represents one or more metal elements selected from Ga, Al, Mn, and Co. For example, Ga, Ga and Al, Ga and Mn, or Ga and Co can be given as M.

Figure 7A:
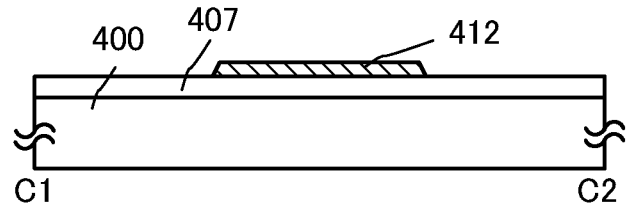
FIGS. 7A to 7E illustrate an example of a structure and a manufacturing method of a transistor.
Figure 7B:
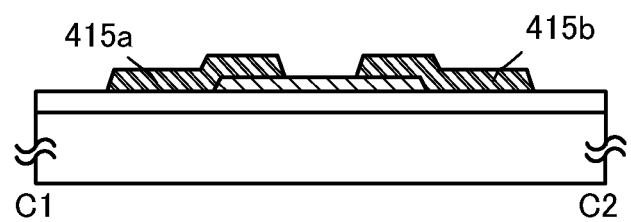

Then, the oxide semiconductor layer is processed into the island-shaped oxide semiconductor layer 412 through a first photolithography step (see FIG. 7A). Note that a resist mask for forming the island-shaped oxide semiconductor layer 412 may be formed with an ink-jet method. Formation of the resist mask with an ink-jet method needs no photomask; thus, manufacturing cost can be reduced.

Note that the etching of the oxide semiconductor layer may be dry etching, wet etching, or both wet etching and dry etching.

In the case of dry etching, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etching gas for dry etching, a gas including chlorine (a chlorine-based gas such as chlorine ($Cl_2$), boron trichloride ($BCl_3$), silicon tetrachloride ($SiCl_4$), or carbon tetrachloride ($CCl_4$)) is preferable but a gas including fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), or the like can also be used. Alternatively, any of these gases to which a rare gas such as helium (He) or argon (Ar) is added can be used.

As an etchant used for wet etching, a solution obtained by mixing phosphoric acid, acetic acid, and nitric acid, an ammonia peroxide mixture (hydrogen peroxide water at 31 wt %: ammonia water at 28 wt %: water=5:2:2), or the like can be used. In addition, ITO07N (produced by KANTO CHEMICAL CO., INC.) may also be used. The etching conditions (e.g., an etchant, an etching time, and a temperature) may be adjusted as appropriate in accordance with a material of the oxide semiconductor.

In the case of wet etching, an etchant is removed by cleaning together with the material which is etched off. The waste liquid including the etchant and the material etched off may be purified and the material may be reused. When a material (e.g., a rare metal such as indium) included in the oxide semiconductor layer is collected from the waste liquid after the etching and reused, the resources can be efficiently used.

In this embodiment, the oxide semiconductor layer is processed into the island-shaped oxide semiconductor layer 412 with a wet etching method with a mixed solution of phosphoric acid, acetic acid, and nitric acid as an etchant.

Next, first heat treatment is performed on the oxide semiconductor layer 412. The temperature of the first heat treatment is 400° C. to 750° C. inclusive, preferably higher than or equal to 400° C. and less than the strain point of the substrate. Here, the substrate is introduced into an electric furnace which is one of heat treatment apparatuses, and heat treatment is performed on the oxide semiconductor layer at 450° C. under a nitrogen atmosphere for 1 hour. Through this first heat treatment, hydrogen, water, hydroxyl, and the like can be removed from the oxide semiconductor layer 412.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas (typically, a rare gas such as argon) or a nitrogen gas can be used.

For example, as the first heat treatment, GRTA by which the substrate is moved into an inert gas heated to a high temperature as high as 650° C. to 700° C., heated for several minutes, and moved out of the inert gas heated to the high temperature may be performed. GRTA enables high-temperature heat treatment for a short time.

In the first heat treatment, it is preferable that water, hydrogen, and the like be not contained in the atmosphere. In addition, an inert gas such as nitrogen, helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

Note that depending on the conditions of the first heat treatment or a material of the oxide semiconductor layer, the oxide semiconductor layer 412 may be crystallized to be microcrystal or a polycrystal. For example, the oxide semiconductor layer may crystallize to become a microcrystalline oxide semiconductor layer having a crystallinity of 80% or more. Note that the island-shaped oxide semiconductor layer 412 may be an amorphous oxide semiconductor layer without crystallization even after the first heat treatment. Further, the island-shaped oxide semiconductor layer 412 may become an oxide semiconductor layer in which a microcrystalline portion (with a grain diameter of 1 nm to 20 nm inclusive, typically 2 nm to 4 nm inclusive) is mixed into an amorphous oxide semiconductor layer.

The first heat treatment of the oxide semiconductor layer may be performed on the oxide semiconductor layer before being processed into the island-shaped oxide semiconductor layer. In that case, after the first heat treatment, the substrate is taken out of the heat treatment apparatus and subjected to the first photolithography step. Alternatively, the first heat treatment may be performed after the source electrode and the drain electrode are stacked over the oxide semiconductor layer. In a similar manner, the first heat treatment may be performed after the formation of the gate insulating layer over the source electrode and the drain electrode.

Although the first heat treatment is performed mainly for the purpose of removing impurities such as hydrogen, water, and hydroxyl from the oxide semiconductor layer, it might generate oxygen defects in the oxide semiconductor layer during the heat treatment. Therefore, the first heat treatment is preferably followed by treatment for supplying oxygen. Specifically, heat treatment under an oxygen atmosphere or a mixed atmosphere of nitrogen and oxygen (e.g., nitrogen to oxygen is 4 to 1 in volume ratio) may be performed as the treatment for supplying oxygen after the first heat treatment, for example. Further, plasma treatment under an oxygen atmosphere can also be employed.

The first heat treatment has an effect of dehydration or dehydrogenation on the oxide semiconductor layer.

Next, a conductive film is formed over the insulating layer 407 and the oxide semiconductor layer 412. The conductive film may be formed with a sputtering method or a vacuum evaporation method. The conductive layer can be formed using a metal material selected from aluminum, copper, chromium, tantalum, titanium, molybdenum, tungsten, and yttrium; an alloy material containing any of these metal materials as its component; a conductive metal oxide; or the like. In addition, in order to prevent generation of hillocks or whiskers, for example, an aluminum material to which an element such as silicon, titanium, tantalum, tungsten, molybdenum, chromium, neodymium, scandium, or yttrium is added may also be used. In this case, heat resistance can be improved. As the conductive metal oxide, indium oxide ($In_2O_3$), tin oxide ($SnO_2$), zinc oxide (ZnO), an indium oxide-tin oxide alloy ($In_2O_3$—$SnO_2$, abbreviated as ITO), an indium oxide-zinc oxide alloy ($In_2O_3$—ZnO), or the metal oxide material including silicon or silicon oxide can be used.

Further, the conductive film may have a single-layer structure or a stacked structure of two or more layers. For example, a single-layer structure of an aluminum film including silicon; a two-layer structure of an aluminum film and a titanium film stacked thereover; a three-layer structure of a titanium film, an aluminum film stacked thereover, and a titanium film stacked thereover; and the like can be given. The conductive film may have a structure in which a metal layer of aluminum, copper, or the like and a high-melting-point metal layer of chromium, tantalum, titanium, molybdenum, tungsten, or the like are stacked.

In this embodiment, a titanium film having a thickness of 150 nm is formed as the conductive film with a sputtering method.

Next, through a second photolithography step, a resist mask is formed over the conductive film, and selective etching is performed, whereby the first electrode 415a and the second electrode 415b are formed. After that, the resist mask is removed (see FIG. 7B). The first electrode 415a serves as one of a source electrode and a drain electrode while the second electrode 415b serves as the other of the source electrode and the drain electrode. Here, when the first electrode 415a and the second electrode 415b are preferably etched so as to have tapered ends, coverage with the gate insulating layer formed thereon will be improved. Note that resist mask for forming the first electrode 415a and the second electrode 415b may be formed with an ink-jet method. Formation of the resist mask with an ink-jet method needs no photomask; thus, manufacturing cost can be reduced.

Note that in order to prevent the oxide semiconductor layer 412 from being removed and the insulating layer 407 thereunder from being exposed at the time of the etching of the conductive film, their materials and etching conditions of the conductive film need to be adjusted as appropriate. Therefore, in this embodiment, an In—Ga—Zn—O-based oxide semiconductor is used as the oxide semiconductor layer 412, a titanium film is used as the conductive film, and an ammonium hydrogen peroxide mixture (hydrogen peroxide water at 31 wt %: ammonia water at 28 wt %: water=5:2:2) is used as an etchant of the titanium film so that part of the oxide semiconductor layer 412 is not etched. However, the present invention is not limited to this structure. In other words, part of the oxide semiconductor layer 412 may be etched through the second photolithography step and an oxide semiconductor layer having a groove (a depression portion) can also be formed.

Ultraviolet, KrF laser light or ArF laser light may be used for light exposure for forming the resist mask in the second photolithography step. A channel length L of the transistor to be formed later depends on the width of an interval between a lower end of the first electrode 415a and a lower end of the second electrode 415b which are adjacent to each other over the oxide semiconductor layer 412. Note that when light exposure is performed in the case where the channel length L is shorter than 25 nm, extreme ultraviolet with extremely short wavelengths of several nanometers to several tens of nanometers is used for light exposure for forming the resist mask in the second photolithography step. Light exposure with extreme ultraviolet leads to a high resolution and a large depth of focus. Accordingly, the channel length L of the transistor to be formed later can be set to 10 nm to 1000 nm inclusive. In this case, an increase in operation speed of the transistor can be achieved, and further, a reduction in power consumption of the transistor can be achieved due to extremely small off-state current value.

Figure 7C:
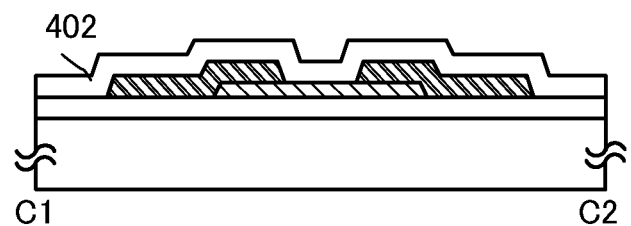

Then, the gate insulating layer 402 is formed over the insulating layer 407, the oxide semiconductor layer 412, the first electrode 415a, and the second electrode 415b (see FIG. 7C).

The gate insulating layer 402 can be formed to have a single-layer structure or a stacked structure including any of a silicon oxide layer, a silicon nitride layer, a silicon oxynitride layer, a silicon nitride oxide layer, and an aluminum oxide layer with a plasma CVD method, a sputtering method, or the like.

The gate insulating layer 402 is preferably formed in such a manner that hydrogen is not included therein. Thus, the gate insulating layer 402 is preferably formed with a sputtering method, in which hydrogen can be reduced as much as possible in an atmosphere during the film formation. In the case where a silicon oxide film is formed with a sputtering method, a silicon target or a quartz target is used as a target, and oxygen or a mixed gas of oxygen and argon is used as a sputtering gas.

The gate insulating layer 402 can have a structure in which a silicon oxide layer and a silicon nitride layer are stacked in this order over the substrate 400. For example, a silicon oxide layer ($SiO_x$ (x>0)) having a thickness of 5 nm to 300 nm inclusive may be formed as a first gate insulating layer and a silicon nitride layer ($SiN_y$ (y>0)) having a thickness of 50 nm to 200 nm inclusive may be formed as a second gate insulating layer over the first gate insulating layer to provide a gate insulating layer having a thickness of 100 nm. In this embodiment, a silicon oxide layer having a thickness of 100 nm is formed with an RF sputtering method under a pressure of 0.4 Pa, a high-frequency power source of 1.5 kW, and a mixed atmosphere of oxygen and argon (the flow ratio of oxygen to argon is 1:1 (each flow rate is 25 sccm)).

Figure 7D:
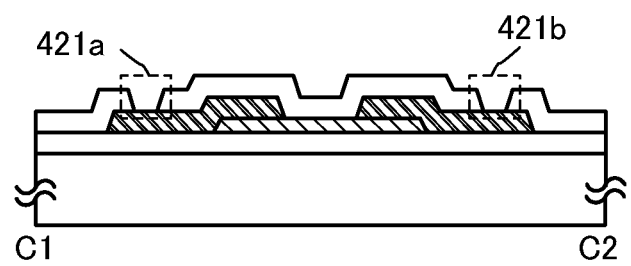

Next, through a third photolithography step, a resist mask is formed, and selective etching is performed to remove part of the gate insulating layer 402, whereby openings 421a and 421b reaching the first electrode 415a and the second electrode 415b are formed (see FIG. 7D). Note that the formation of the resist mask with an ink-jet method needs no photomask; thus, manufacturing cost can be reduced.

Then, after the formation of a conductive film over the gate insulating layer 402 and in the openings 421a and 421b, the gate electrode 411, the first wiring layer 414a, and the second wiring layer 414b are formed through a fourth photolithography step.

The gate electrode 411, the first wiring layer 414a, and the second wiring layer 414b can be formed to have a single-layer structure or a stacked structure using a metal material such as molybdenum, titanium, chromium, tantalum, tungsten, aluminum, copper, neodymium, or scandium, or an alloy material containing any of these materials as its main component. Specific examples of a two-layer structure of the gate electrode 411, the first wiring layer 414a, and the second wiring layer 414b include a structure including an aluminum layer and a molybdenum layer thereover, a structure including a copper layer and a molybdenum layer thereover, a structure including a copper layer and a titanium nitride layer or a tantalum nitride layer thereover, and a structure including a titanium nitride layer and a molybdenum layer thereover. Specific examples of a three-layer structure includes a structure in which a tungsten layer or a tungsten nitride layer, an alloy layer of aluminum and silicon or an alloy layer of aluminum and titanium, and a titanium nitride layer or a titanium layer are stacked. A light-transmitting conductive film may also be used for forming the gate electrode. As a light-transmitting conductive film, a film of a light-transmitting conductive oxide can be specifically given.

In this embodiment, as the gate electrode 411, the first wiring layer 414a, and the second wiring layer 414b, a titanium film having a thickness of 150 nm is formed with a sputtering method.

Next, second heat treatment (preferably at 200° C. to 400° C. inclusive, for example, 250° C. to 350° C. inclusive) is performed under an inert gas atmosphere or an oxygen gas atmosphere. In this embodiment, the second heat treatment is performed at 250° C. under a nitrogen atmosphere for 1 hour. Note that the second heat treatment may be performed after the formation of a protective insulating layer or a planarization insulating layer over the transistor 410.

Heat treatment may be further performed at 100° C. to 200° C. inclusive in air for 1 hour to 30 hours inclusive. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the protective insulating layer or the planarization insulating layer. Under reduced pressure, the heating time can be shortened, which is preferable.

Figure 7E:
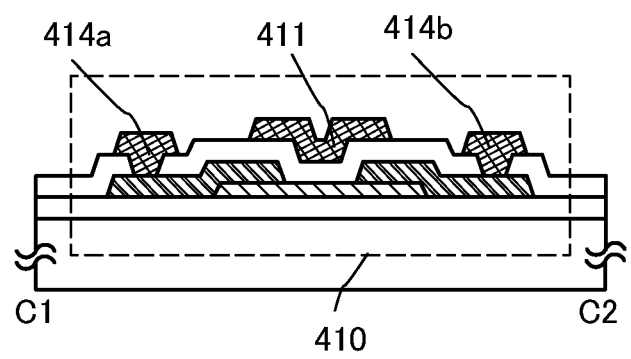

Through the above process, the transistor 410 including the high-purity oxide semiconductor layer 412 in which the concentration of hydrogen, moisture, hydride, or hydroxide is reduced can be formed (see FIG. 7E). The transistor 410 can be used for the transistor described in Embodiment 1, for example.

In addition, a protective insulating layer or a planarization insulating layer for planarization may be formed over the transistor 410. The protective insulating layer can be formed to have a single-layer structure or a stacked structure including any of a silicon oxide layer, a silicon nitride layer, a silicon oxynitride layer, a silicon nitride oxide layer, and an aluminum oxide layer. The planarization insulating layer can be formed using an organic material having heat resistance, such as polyimide, acrylic, benzocyclobutene, polyamide, or epoxy. As an alternative to such organic materials, it is also possible to use a low-dielectric constant material (a low-k material), a siloxane-based resin, phosphosilicate glass (PSG), borophosphosilicate glass (BPSG), or the like. The planarization insulating layer may be formed by stacking a plurality of insulating films formed using any of these materials.

Here, the siloxane-based resin corresponds to a resin including a Si—O—Si bond which is formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer, and any of the following can be employed, which depends on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater.

As described above, by removing moisture remaining in the reaction atmosphere at the time of forming the oxide semiconductor layer, the concentration of hydrogen and hydride in the oxide semiconductor layer can be reduced.

As described above, a transistor including an intrinsic or substantially intrinsic oxide semiconductor can be manufactured.

Embodiment 3

In this embodiment, another example of a structure of a transistor including an intrinsic or substantially intrinsic oxide semiconductor and another example of a manufacturing method thereof will be described.

Figure 8A:
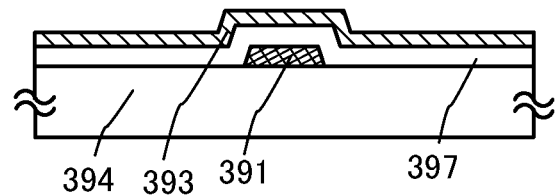
FIGS. 8A to 8E illustrate an example of a structure and a manufacturing method of a transistor.
Figure 8B:
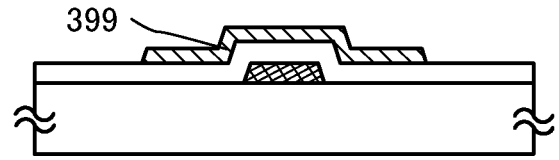
Figure 8C:
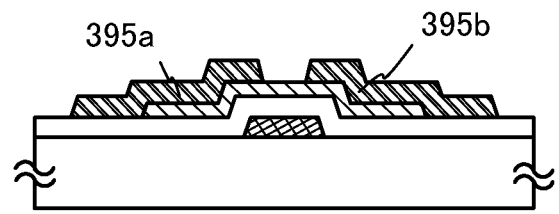
Figure 8D:
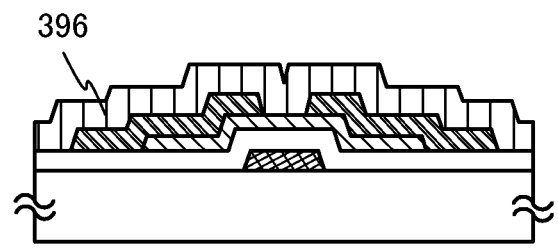
Figure 8E:
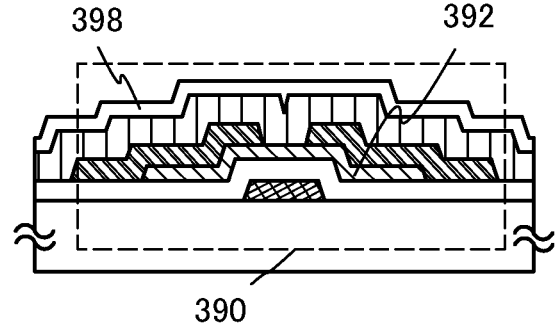

FIGS. 8A to 8E illustrate an example of a structure and a manufacturing method of a transistor. A transistor 390 illustrated in FIG. 8E is one type of a bottom gate structure and is also referred to as an inverted staggered transistor. The transistor 390 can be used for the transistor described in Embodiment 1, for example. Note that although the transistor 390 has a single-gate structure, the present invention is not limited to this structure. The transistor may have a multi-gate structure which includes a plurality of gate electrodes and a plurality of channel formation regions.

A manufacturing method of the transistor 390 over a substrate 394 will be described below with reference to FIGS. 8A to 8E.

First, a conductive film is formed over the substrate 394, and then, a gate electrode 391 is formed through a first photolithography step. It is preferable that an end portion of the formed gate electrode be tapered because coverage with a gate insulating layer formed thereover is improved. Note that a resist mask may be formed with an ink-jet method. Formation of the resist mask with an ink-jet method needs no photomask; thus, manufacturing cost can be reduced.

For the material of the substrate 394, a material similar to that of the substrate 400 described in the above embodiment can be employed. For the material and the formation method of the gate electrode 391, a material and a method similar to those of the gate electrode 411 described in the above embodiment can be employed.

Note that an insulating film serving as a base film may be provided between the substrate 394 and the gate electrode 391. The base film has a function of preventing diffusion of an impurity element from the substrate 394, and can be formed to have a single-layer structure or a stacked structure including one or more of a silicon nitride film, a silicon oxide film, a silicon nitride oxide film, and a silicon oxynitride film.

Then, a gate insulating layer 397 is formed over the gate electrode 391.

The gate insulating layer 397 can be formed to have a single-layer structure or a stacked structure including any of a silicon oxide layer, a silicon nitride layer, a silicon oxynitride layer, a silicon nitride oxide layer, and an aluminum oxide layer with a plasma CVD method, a sputtering method, or the like. Note that in order to prevent the gate insulating layer 397 from containing a large amount of hydrogen, the gate insulating layer 397 is preferably formed with a sputtering method. In the case where a silicon oxide film is formed with a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked in this order over the gate electrode 391. For example, a silicon nitride layer ($SiN_y$ (y>0)) having a thickness of 50 nm to 200 nm inclusive may be formed with a sputtering method as a first gate insulating layer and a silicon oxide layer ($SiO_x$ (x>0)) having a thickness of 5 nm to 300 nm inclusive may be formed as a second gate insulating layer over the first gate insulating layer to provide a gate insulating layer having a thickness of 100 nm.

Next, over the gate insulating layer 397, an oxide semiconductor layer 393 is formed to a thickness of 2 nm to 200 nm inclusive, preferably 5 nm to 30 nm inclusive (see FIG. 8A).

Here, for the material and the formation method of the oxide semiconductor layer 393, a material and a method similar to those of the oxide semiconductor layer (the island-shaped oxide semiconductor layer 412) described in the above embodiment can be employed.

An example of the film formation condition for the oxide semiconductor layer 393 is as follows: the distance between the substrate and the target is 100 mm; the pressure is 0.6 Pa; the direct current (DC) power source is 0.5 kW; the atmosphere is oxygen (the proportion of the oxygen flow is 100%); and a sputtering method is used. Note that a pulse direct current (DC) power source is preferable because dust can be reduced and the film thickness can be uniform. The thickness of the oxide semiconductor layer 393 is preferably 2 nm to 200 nm inclusive, preferably 5 nm to 30 nm inclusive. Note that an appropriate thickness of the oxide semiconductor layer 393 varies depending on an oxide semiconductor material; therefore, the thickness may be determined as appropriate depending on the material.

Note that before the formation of the oxide semiconductor layer 393, dust attached to a surface of the gate insulating layer 397 is preferably removed by reverse sputtering in which an argon gas is introduced and plasma is generated.

In order that as little hydrogen, hydroxyl, and moisture as possible are contained in the gate insulating layer 397 and the oxide semiconductor layer 393, it is preferable that the substrate 394 over which the gate electrode 391 is formed or the substrate 394 over which the gate electrode 391 and the gate insulating layer 397 are formed be preheated in a preheating chamber of a sputtering apparatus as pretreatment for film formation so that impurities such as hydrogen or moisture adsorbed on the substrate 394 are eliminated and removed. The temperature of the preheating may be 100° C. to 400° C. inclusive, preferably 150° C. to 300° C. inclusive. As an evacuation unit, a cryopump is preferably provided in the preheating chamber. Further, this preheating may be similarly performed on the substrate 394 over which the gate electrode 391, the gate insulating layer 397, an oxide semiconductor layer 399, a first electrode 395a, and a second electrode 395b are formed, before the formation of a protective insulating layer 396.

Then, the oxide semiconductor layer is processed into the island-shaped oxide semiconductor layer 399 through a second photolithography step (see FIG. 8B). Note that for the process method of the island-shaped oxide semiconductor layer 399, a process method similar to that of the island-shaped oxide semiconductor layer 412 described in the above embodiment can be employed.

Note that before the formation of a conductive film in the subsequent step, reverse sputtering is preferably performed so that a resist residue or the like attached to surfaces of the oxide semiconductor layer 399 and the gate insulating layer 397 is removed.

Then, a conductive film is formed over the gate insulating layer 397 and the oxide semiconductor layer 399. The conductive film may be formed with a sputtering method, a vacuum evaporation method, or the like. As a material of the conductive film, an element selected from aluminum, chromium, copper, tantalum, titanium, molybdenum, and tungsten; an alloy containing any of these elements as its component; an alloy containing any of these elements in combination; or the like can be used. Moreover, one or more materials selected from manganese, magnesium, zirconium, beryllium, and yttrium may be included. Further, a light-transmitting conductive film may be used. As a light-transmitting conductive film, a film of a light-transmitting conductive oxide can be specifically given.

Further, the conductive film may have a single-layer structure or a stacked structure of two or more layers. For example, a single-layer structure of an aluminum film including silicon; a two-layer structure of an aluminum film and a titanium film stacked thereover; a three-layer structure of a titanium film, an aluminum film stacked thereover, and a titanium film stacked thereover; and the like can be given.

Then, through a third photolithography step, a resist mask is formed over the conductive film, and selective etching is performed, whereby the first electrode 395a and the second electrode 395b are formed. After that, the resist mask is removed (see FIG. 8C). Here, in order to prevent the oxide semiconductor layer 399 from being removed and the insulating layer 397 thereunder from being exposed at the time of the etching of the conductive film, their materials and etching conditions of the conductive film need to be adjusted as appropriate. Therefore, in this embodiment, an In—Ga—Zn—O-based oxide semiconductor is used as the oxide semiconductor layer 399, a titanium film is used as the conductive film, and an ammonium hydrogen peroxide mixture (hydrogen peroxide water at 31 wt %: ammonia water at 28 wt %: water=5:2:2) is used as an etchant of the titanium film so that part of the oxide semiconductor layer 399 is not etched.

However, the present invention is not limited to this structure. In other words, part of the oxide semiconductor layer 399 may be etched through the third photolithography step and an oxide semiconductor layer having a groove (a depression portion) can also be formed.

Ultraviolet, KrF laser light or ArF laser light may be used for light exposure for forming the resist mask in the third photolithography step. A channel length L of the transistor to be formed later depends on the width of an interval between a lower end of the first electrode 395a and a lower end of the second electrode 395b which are adjacent to each other over the oxide semiconductor layer 399. Note that when light exposure is performed in the case where the channel length L is shorter than 25 nm, extreme ultraviolet with extremely short wavelengths of several nanometers to several tens of nanometers is used for light exposure for forming the resist mask in the third photolithography step. Light exposure with extreme ultraviolet leads to a high resolution and a large depth of focus. Accordingly, the channel length L of the transistor to be formed later can be set to 10 nm to 1000 nm inclusive. In this case, an increase in operation speed of the transistor can be achieved, and further, a reduction in power consumption of the transistor can be achieved due to extremely small off-state current value.

In order to reduce the number of photomasks and steps in the photolithography step, an etching step may be performed with the use of a resist mask formed using a multi-tone mask which is a light-exposure mask through which light is transmitted so as to have a plurality of intensities. A resist mask formed using a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can be also reduced, whereby simplification of a process can be realized.

After the formation of the first electrode 395a and the second electrode 395b by the above etching, plasma treatment using a gas such as $N_2O$, $N_2$, or Ar may be performed to remove water or the like adsorbed on an exposed surface of the oxide semiconductor layer 399. Plasma treatment may be performed using a mixture gas of oxygen and argon as well. In this embodiment, either plasma treatment described above is performed.

Then, after the plasma treatment, a protective insulating layer 396 which is in contact with the exposed oxide semiconductor layer 399, the first electrode 395a, and the second electrode 395b is formed without exposure to air (see FIG. 8D). At this time, it is preferable that the protective insulating layer 396 be formed while moisture remaining in the process chamber is removed so that the oxide semiconductor layer 399 and the protective insulating layer 396 can be prevented from including hydrogen, hydroxyl, or moisture. In order to remove moisture remaining in the process chamber, an entrapment vacuum pump is preferably used. For example, a cryopump, an ion pump, or a titanium sublimation pump is preferably used. The evacuation unit may be a turbo pump provided with a cold trap. In the film formation chamber which is evacuated with the cryopump, a hydrogen atom, a compound containing a hydrogen atom, such as water ($H_2O$), or the like is removed, whereby the concentration of an impurity contained in the protective insulating layer 396 formed in the film formation chamber can be reduced.

In this embodiment, an oxide insulating layer is formed as the protective insulating layer 396. For the formation of the protective insulating layer 396, the substrate 394 over which the island-shaped oxide semiconductor layer 399, the first electrode 395a, and the second electrode 395b are formed is kept at room temperature or heated to a temperature lower than 100° C., a sputtering gas which contains high-purity oxygen and from which hydrogen and moisture have been removed is introduced, and a silicon semiconductor target is used, whereby a silicon oxide layer is formed. Note that instead of a silicon oxide layer, a silicon oxynitride layer, an aluminum oxide layer, an aluminum oxynitride layer, or the like can be used as the oxide insulating layer.

An example of the film formation condition for the above silicon oxide layer is as follows: a boron-doped silicon target which has a purity of 6N (the resistivity is 0.01 Ωcm) is used; the distance between the substrate and the target (T-S distance) is 89 mm; the pressure is 0.4 Pa; the direct-current (DC) power source is 6 kW; the atmosphere is oxygen (the proportion of the oxygen flow is 100%); and a pulse DC sputtering method is used. The thickness of the silicon oxide layer is 300 nm. Note that instead of the silicon target, quartz (preferably, synthetic quartz) can also be used. As a sputtering gas, an oxygen gas or a mixed gas of oxygen and argon may be used.

Further, heat treatment is preferably performed at 100° C. to 400° C. while the protective insulating layer 396 and the oxide semiconductor layer 399 are in contact with each other. The oxide insulating layer 396 in this embodiment contains a large number of defects; therefore, with this heat treatment, impurities such as hydrogen, moisture, hydroxyl, or hydride contained in the oxide semiconductor layer 399 can be diffused into the protective insulating layer 396, so that the impurities contained in the oxide semiconductor layer 399 can be further reduced.

Through the above process, the transistor 390 including an oxide semiconductor layer 392 in which the concentration of hydrogen, moisture, hydroxyl, or hydride is reduced can be formed (see FIG. 8E). As described in this embodiment, by removing moisture remaining in the reaction atmosphere at the time of forming the oxide semiconductor layer, the concentration of hydrogen and hydride in the oxide semiconductor layer can be reduced. As a result, an intrinsic or substantially intrinsic semiconductor can be obtained.

Note that an insulating layer may be additionally provided over the protective insulating layer 396. In this embodiment, an insulating layer 398 is formed over the protective insulating layer 396. As the insulating layer 398, a silicon nitride film, a silicon nitride oxide film, an aluminum nitride film, an aluminum nitride oxide film, or the like may be used.

For the formation of the insulating layer 398, the substrate 394 over which the gate electrode 391, the gate insulating layer 397, the oxide semiconductor layer 399, the first electrode 395a, the second electrode 395b, and the protective insulating layer 396 are formed is heated to a temperature of 100° C. to 400° C., a sputtering gas which contains high-purity nitrogen and from which hydrogen and moisture are removed is introduced, and a silicon semiconductor target is used, whereby a silicon nitride film is formed. In this case also, it is preferable that the insulating layer 398 be formed while moisture remaining in the process chamber is removed as in the case of the protective insulating layer 396. By heating the substrate 394 to 100° C. to 400° C. during the film formation of the insulating layer 398, hydrogen or moisture contained in the oxide semiconductor layer 399 can be diffused into the insulating layer 398. In that case, heat treatment is not necessarily performed directly after the formation of the protective insulating layer 396.

In the case where a silicon oxide layer is formed as the protective insulating layer 396 and a silicon nitride layer is formed as the insulating layer 398, the silicon oxide layer and the silicon nitride layer can be formed in the same process chamber using the same silicon target. First, a sputtering gas containing oxygen is introduced and the silicon oxide layer is formed using a silicon target placed inside the process chamber, and then the sputtering gas is switched to a sputtering gas containing nitrogen and the silicon nitride layer is formed using the same silicon target. The silicon oxide layer and the silicon nitride layer can be formed in succession without exposure to air; therefore, impurities such as hydrogen or moisture can be prevented from being adsorbed on a surface of the silicon oxide layer. Note that after the silicon oxide layer is formed as the protective insulating layer 396 and the silicon nitride layer is formed thereover as the insulating layer 398, heat treatment (at a temperature of 100° C. to 400° C.) for diffusing hydrogen or moisture contained in the oxide semiconductor layer into the oxide insulating layer is preferably performed.

Heat treatment may be further performed at 100° C. to 200° C. inclusive in air for 1 hour to 30 hours inclusive after the formation of the protective insulating layer 396. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating layer. Under reduced pressure, the heating time can be shortened.

The above process are performed at 400° C. or lower; therefore, the above process can also be applied to a manufacturing process in which a glass substrate having a thickness of 1 mm or less and having a side that is longer than 1 m is used. In addition, since the whole process can be performed at a treatment temperature of 400° C. or lower, a display panel can be manufactured with less energy consumption.

As described above, a transistor including an intrinsic or substantially intrinsic oxide semiconductor can be manufactured.

Embodiment 4

In this embodiment, another example of a structure of a transistor including an intrinsic or substantially intrinsic oxide semiconductor and another example of a manufacturing method thereof will be described.

Figure 9A:
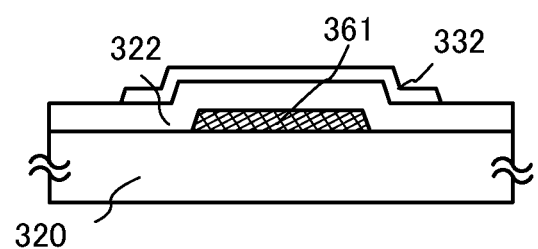
FIGS. 9A to 9D illustrate an example of a structure and a manufacturing method of a transistor.
Figure 9B:
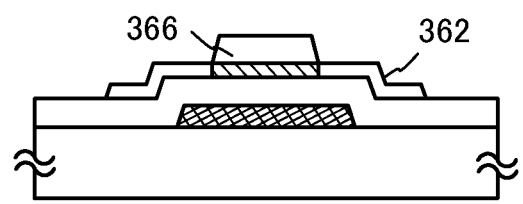
Figure 9C:
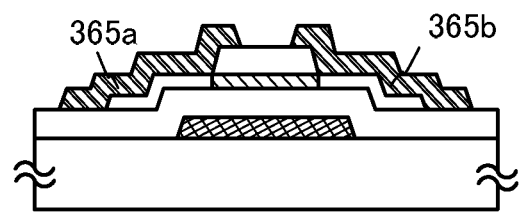
Figure 9D:
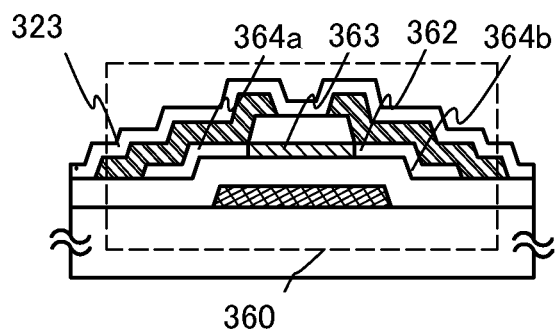

FIGS. 9A to 9D illustrate an example of a structure and a manufacturing method of a transistor. A transistor 360 illustrated in FIG. 9D is one type of a bottom gate structure which is referred to as a channel-protective type (also referred to as a channel-stop type) and is also referred to as an inverted staggered transistor. The transistor 360 can be used for the transistor described in Embodiment 1, for example. Note that although the transistor 360 has a single-gate structure, the present invention is not limited to this structure. The transistor may have a multi-gate structure which includes a plurality of gate electrodes and a plurality of channel formation regions.

A manufacturing method of the transistor 360 over a substrate 320 will be described below with reference to FIGS. 9A to 9D.

First, a conductive film is formed over the substrate 320, and then, a gate electrode 361 is formed through a first photolithography step. For the material of the substrate 320, a material similar to that of the substrate 394 described in the above embodiment can be employed. For the material and the formation method of the gate electrode 361, a material and a method similar to those of the gate electrode 391 described in the above embodiment can be employed.

Then, a gate insulating layer 322 is formed over the gate electrode 361. For the material of the gate insulating layer 322, a material similar to that of the gate insulating layer 397 described in the above embodiment can be employed. In this embodiment, a silicon oxynitride layer having a thickness of 100 nm or less is formed as the gate insulating layer 322 with a plasma CVD method.

Then, an oxide semiconductor layer having a thickness of 2 nm to 200 nm inclusive is formed over the gate insulating layer 322 and processed into an island-shaped oxide semiconductor layer 332 through a second photolithography step. For the material and the formation method of the island-shaped oxide semiconductor layer, a material and a method similar to those of the island-shaped oxide semiconductor layer 399 described in the above embodiment can be employed. In this embodiment, the oxide semiconductor layer is formed using an In—Ga—Zn—O-based oxide semiconductor target with a sputtering method.

Next, dehydration or dehydrogenation of the oxide semiconductor layer 332 is performed. The temperature of first heat treatment for dehydration or dehydrogenation is 400° C. to 750° C. inclusive, preferably higher than or equal to 400° C. and lower than the strain point of the substrate. Here, the substrate is introduced into an electric furnace which is one of heat treatment apparatuses, and heat treatment is performed on the oxide semiconductor layer 332 at 450° C. under a nitrogen atmosphere for 1 hour (see FIG. 9A). Note that this step causes oxygen deficiency in the oxide semiconductor layer 332, so that the oxide semiconductor layer 332 has a low-resistance Then, plasma treatment using a gas such as $N_2O$, $N_2$, or Ar is performed. By this plasma treatment, water or the like adsorbed on an exposed surface of the oxide semiconductor layer is removed. Plasma treatment may be performed using a mixed gas of oxygen and argon as well.

Next, an oxide insulating layer is formed over the gate insulating layer 322 and the oxide semiconductor layer 332. After that, through a third photolithography step, a resist mask is formed, and selective etching is performed on the oxide insulating layer, whereby an oxide insulating layer 366 is formed. After that, the resist mask is removed.

In this embodiment, a silicon oxide film having a thickness of 200 nm is formed as the oxide insulating layer 366 with a sputtering method. The substrate temperature during the film formation may be room temperature to 300° C. inclusive and, in this embodiment, is 100° C. The silicon oxide film can be formed with a sputtering method under a rare gas (typically, argon) atmosphere, an oxygen atmosphere, or a mixed atmosphere of a rare gas (typically, argon) and oxygen. As a target, a silicon oxide target or a silicon target can be used. For example, with the use of a silicon target, a silicon oxide film can be formed with a sputtering method under a mixed atmosphere of oxygen and nitrogen. As the oxide insulating layer 366 which is formed in contact with the oxide semiconductor layer 332, an inorganic insulating film which does not include impurities such as moisture, a hydrogen ion, and OH⁻ and blocks entry of these from the outside can be used. Typically, a silicon oxide film, a silicon oxynitride film, an aluminum oxide film, an aluminum oxynitride film, or the like can be used.

At this time, it is preferable that the oxide insulating layer 366 be formed while moisture remaining in the process chamber is removed so that the oxide semiconductor layer 332 and the oxide insulating layer 366 can be prevented from including hydrogen, hydroxyl, or moisture. As for a method for removing moisture remaining in the process chamber, the method described in other embodiments can be employed.

Next, second heat treatment (preferably at 200° C. to 400° C. inclusive, for example, 250° C. to 350° C. inclusive) is performed under an inert gas atmosphere or an oxygen gas atmosphere. For example, the second heat treatment is performed at 250° C. under a nitrogen atmosphere for 1 hour. When the second heat treatment is performed, heat is applied while part of the oxide semiconductor layer (a channel formation region) is in contact with the oxide insulating layer 366. At this time, the resistance of a region covered with the oxide insulating layer 366 is increased because oxygen is supplied from the oxide insulating layer.

On the other hand, by the heat treatment under a nitrogen atmosphere or an inert gas atmosphere or under reduced pressure, the resistance of the exposed region of the oxide semiconductor layer 332, which is not covered with the oxide insulating layer 366, can be further reduced because of oxygen deficiency.

In other words, by the second heat treatment, the oxide semiconductor layer 332 becomes an oxide semiconductor layer 362 including regions with different resistances (indicated as a shaded region and a white region in FIG. 9B).

Then, a conductive film is formed over the gate insulating layer 322, the oxide semiconductor layer 362, and the oxide insulating layer 366. After that, through a fourth photolithography step, a resist mask is formed, and selective etching is performed to form a first electrode 365a and a second electrode 365b. After that, the resist mask is removed (see FIG. 9C).

As a material of the first electrode 365a and the second electrode 365b, an element selected from aluminum, chromium, copper, tantalum, titanium, molybdenum, and tungsten; an alloy containing any of these elements as its component; an alloy containing any of these elements in combination; or the like can be used. Further, the metal conductive film may have a single-layer structure or a stacked structure of two or more layers.

Through the above process, heat treatment for dehydration or dehydrogenation is performed on the formed oxide semiconductor layers to reduce the resistance, and then, part of the oxide semiconductor layers is selectively made in an oxygen-excess state. As a result, a channel formation region 363 which overlaps with the gate electrode 361 becomes intrinsic or substantially intrinsic. In addition, a low-resistance region 364a which overlaps with the first electrode 365a and a low-resistance region 364b which overlaps with the second electrode 365b are formed in a self-aligned manner. Through the above process, the transistor 360 is formed.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating layer. Under reduced pressure, the heating time can be shortened. With such heat treatment, a slight amount of hydrogen which remains in the oxide semiconductor layer is introduced into the oxide insulating layer; thus, an intrinsic or substantially intrinsic oxide semiconductor layer can be obtained.

By forming the low-resistance region 364b (and the low-resistance region 364a) in the oxide semiconductor layer which overlaps with the second electrode 365b (and the first electrode 365a), the reliability of the transistor can be improved. Specifically, by forming the low-resistance region 364b, the conductivity can vary stepwise from the second electrode 365b to the low-resistance region 364b and the channel formation region 363. Therefore, in the case where the transistor operates with the second electrode 365b connected to a wiring for supplying a high power supply potential VDD, the low-resistance region serves as a buffer and a high electric field is not applied locally even if a high electric field is applied between the gate electrode 361 and the second electrode 365b; thus, the breakdown voltage of the transistor can be improved.

Then, a protective insulating layer 323 is formed over the first electrode 365a, the second electrode 365b, and the oxide insulating layer 366. In this embodiment, the protective insulating layer 323 is formed using a silicon nitride film (see FIG. 9D).

As described above, a transistor including an intrinsic or substantially intrinsic oxide semiconductor can be manufactured.

This embodiment can be implemented in appropriate combination with the other embodiments.

Embodiment 5

In this embodiment, another example of a structure of a transistor including an intrinsic or substantially intrinsic oxide semiconductor and another example of a manufacturing method thereof will be described. A transistor 350 in this embodiment can be used for, for example, the transistor of Embodiment 1.

Figure 10A:
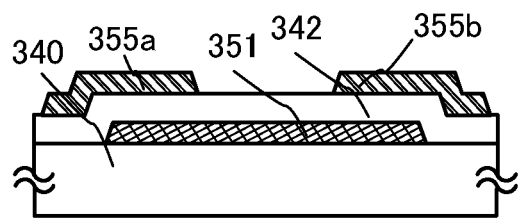
FIGS. 10A to 10D illustrate an example of a structure and a manufacturing method of a transistor.
Figure 10B:
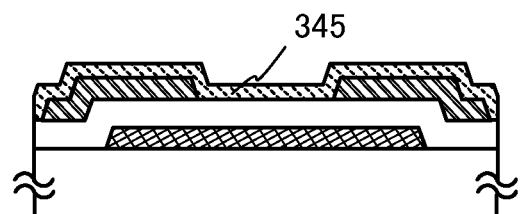
Figure 10C:
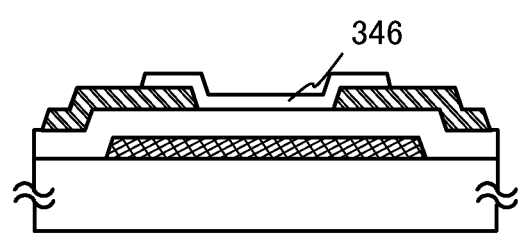
Figure 10D:
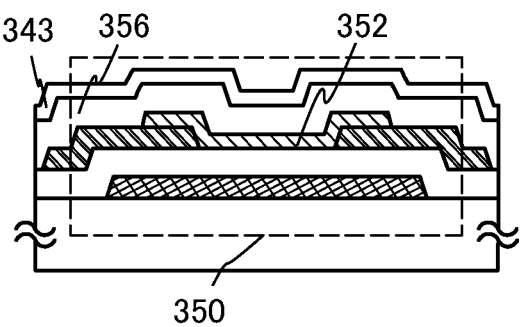

Although the transistor 350 in FIG. 10D has a single-gate structure, the present invention is not limited to this structure. The transistor may have a multi-gate structure which includes a plurality of gate electrodes and a plurality of channel formation regions.

A manufacturing method of the transistor 350 over a substrate 340 will be described below with reference to FIGS. 10A to 10D.

First, a conductive film is formed over the substrate 340, and then, a gate electrode 351 is formed through a first photolithography step. In this embodiment, a tungsten film having a thickness of 150 nm is formed as the gate electrode 351 with a sputtering method.

Then, a gate insulating layer 342 is formed over the gate electrode 351. In this embodiment, a silicon oxynitride film having a thickness of 100 nm or less is formed as the gate insulating layer 342 with a plasma CVD method.

Then, a conductive film is formed over the gate insulating layer 342 and, through a second photolithography step, a resist mask is formed over the conductive film, and selective etching is performed, whereby a first electrode 355a and a second electrode 355b are formed. After that, the resist mask is removed (see FIG. 10A).

Next, an oxide semiconductor layer 345 is formed (see FIG. 10B). In this embodiment, the oxide semiconductor layer 345 is formed using an In—Ga—Zn—O-based oxide semiconductor target with a sputtering method. Subsequently, the oxide semiconductor layer 345 is processed into an island-shaped oxide semiconductor layer through a third photolithography step.

In the step of forming the oxide semiconductor layer 345, it is preferable that the oxide semiconductor layer 345 be formed while moisture remaining in the process chamber is removed so that the oxide semiconductor layer 345 can be prevented from including hydrogen, hydroxyl, or moisture.

As for a method for removing moisture remaining in the process chamber, the method described in other embodiments can be employed.

Then, first treatment is performed on the oxide semiconductor layer for dehydration or dehydrogenation. The temperature of the first heat treatment is 400° C. to 750° C. inclusive, preferably higher than or equal to 400° C. and less than the strain point of the substrate. Here, the substrate is put in an electric furnace that is a kind of heat treatment apparatus and heat treatment is performed on the oxide semiconductor layer at 450° C. under a nitrogen atmosphere for 1 hour, and then water and hydrogen are prevented from entering the oxide semiconductor layer with the oxide semiconductor layer not exposed to air; thus, an oxide semiconductor layer 346 is obtained (see FIG. 10C).

In addition, as the first heat treatment, GRTA by which the substrate is moved into an inert gas heated to a high temperature as high as 650° C. to 700° C., heated for several minutes, and moved out of the inert gas heated to the high temperature may be performed.

Then, an oxide insulating layer 356 is formed in contact with the oxide semiconductor layer 346. The oxide insulating layer 356 can be formed with a thickness of 1 nm or more with a method with which impurities such as water or hydrogen is not mixed into the oxide insulating layer 356 (e.g., a sputtering method) as appropriate. When hydrogen is contained in the oxide insulating layer 356, entry of the hydrogen to the oxide semiconductor layer or extraction of oxygen in the oxide semiconductor layer by the hydrogen is caused, thereby causing the backchannel of the oxide semiconductor layer to have lower resistance (to be n-type), so that a parasitic channel might be formed. Therefore, it is important to form the oxide insulating layer 356 with a method with which hydrogen included in the oxide insulating layer 356 is reduced as much as possible.

Note that for the material and the formation method of the oxide insulating layer 356, a material and a method similar to those of the protective insulating layer 396 described in the above embodiment can be employed.

Next, second heat treatment (preferably at 200° C. to 400° C. inclusive, for example, 250° C. to 350° C. inclusive) is performed under an inert gas atmosphere or an oxygen gas atmosphere. For example, the second heat treatment is performed at 250° C. under a nitrogen atmosphere for 1 hour. When the second heat treatment is performed, heat is applied while part of the oxide semiconductor layer is in contact with the oxide insulating layer 356.

Through the above process, the oxide semiconductor layer which is reduced in resistance due to the dehydration or dehydrogenation during the first heat treatment is brought into an oxygen-excess state. As a result, an intrinsic or substantially intrinsic oxide semiconductor layer 352 is formed. Through the above process, the transistor 350 is formed.

Heat treatment may be further performed at 100° C. to 200° C. inclusive in air for 1 hour to 30 hours inclusive. In this embodiment, the heat treatment is performed at 150° C. for 10 hours. This heat treatment may be performed at a fixed heating temperature or the temperature may be increased from room temperature to a heating temperature of 100° C. to 200° C. inclusive and decreased from the heating temperature to room temperature, plural times repeatedly. Further, this heat treatment may be performed under reduced pressure before the formation of the oxide insulating layer. Under reduced pressure, the heating time can be shortened. With such heat treatment, a slight amount of hydrogen which remains in the oxide semiconductor layer is introduced into the oxide insulating layer; thus, a normally-off transistor can be obtained. Thus, the reliability of a display device can be improved.

Note that an insulating layer may be additionally provided over the oxide insulating layer 356. In this embodiment, an insulating layer 343 is formed over the oxide insulating layer 356 (see FIG. 10D). For the material and the formation method of the insulating layer 343, a material and a method similar to those of the insulating layer 398 described in the above embodiment can be employed.

Further, a planarization insulating layer may be provided for the purpose of planarizing a surface of the insulating layer 343.

As described above, a transistor including an intrinsic or substantially intrinsic oxide semiconductor can be manufactured.

The present application is based on Japanese Patent Application serial No. 2009-292851 filed with the Japan Patent Office on Dec. 24, 2009, the entire contents of which are hereby incorporated by reference.

The invention claimed is:

1. A display device comprising:
a first signal line;
a second signal line adjacent to the first signal line;
a third signal line intersecting with the first signal line and the second signal line;
a transistor including a gate electrode, a gate insulating layer over the gate electrode, an oxide semiconductor film over the gate insulating layer, an oxide insulating layer over the oxide semiconductor film, and electrodes over the oxide semiconductor film and the oxide insulating layer; and
a pixel electrode,
wherein the transistor is electrically connected to the first signal line, the third signal line and the pixel electrode,
wherein the pixel electrode overlaps with the first signal line in a first region,
wherein the pixel electrode overlaps with the second signal line in a second region,
wherein an overlapping area between the pixel electrode and the first signal line is substantially equal to an overlapping area between the pixel electrode and the second signal line,
wherein the oxide semiconductor film comprises a first semiconductor region and a second semiconductor region in the same film,
wherein a resistance of the first semiconductor region is higher than a resistance of the second semiconductor region,
wherein the first semiconductor region is a channel formation region which comprises a region of an oxygen-excess state,
wherein the second semiconductor region comprises an oxygen deficiency, and
wherein the oxide insulating layer is over and in contact with the first semiconductor region.

2. The display device according to claim 1, wherein the channel formation region of the oxide semiconductor film comprises an intrinsic oxide semiconductor or a substantially intrinsic oxide semiconductor.

3. The display device according to claim 1, wherein an off-state current per unit channel width of the transistor is 1 [aA/μm] or less.

4. The display device according to claim 1, wherein the first signal line is a source signal line.

5. The display device according to claim 1, wherein the second signal line is a source signal line.

6. The display device according to claim 1, wherein the third signal line is a gate signal line.

7. The display device according to claim 1, wherein the oxide semiconductor film includes indium, gallium, and zinc.

8. The display device according to claim 1, wherein the pixel electrode overlaps with the third signal line.

9. The display device according to claim 1, wherein a grain diameter of the microcrystalline portion ranges from 1 nm to 20 nm.

10. The display device according to claim 1, wherein the oxide semiconductor film has a crystallinity of 80% or more.

11. The display device according to claim 1, wherein the oxide semiconductor film comprises a microcrystalline portion.

12. A display device comprising:
a first source signal line;
a second source signal line adjacent to the first source signal line;
a gate signal line intersecting with the first source signal line and the second source signal line;
a transistor including a gate electrode, a gate insulating layer over the gate electrode, an oxide semiconductor film over the gate insulating layer, an oxide insulating layer over the oxide semiconductor film, and electrodes over the oxide semiconductor film and the oxide insulating layer; and
a pixel electrode,
wherein the transistor is electrically connected to the first source signal line, the gate signal line and the pixel electrode,
wherein the pixel electrode overlaps with the first source signal line in a first region,
wherein the pixel electrode overlaps with the second source signal line in a second region,
wherein an overlapping area between the pixel electrode and the first source signal line is substantially equal to an overlapping area between the pixel electrode and the second source signal line,
wherein the oxide semiconductor film comprises a first semiconductor region and a second semiconductor region in the same film,
wherein a resistance of the first semiconductor region is higher than a resistance of the second semiconductor region,
wherein the first semiconductor region is a channel formation region which comprises a region of an oxygen-excess state,
wherein the second semiconductor region comprises an oxygen deficiency, and
wherein the oxide insulating layer is over and in contact with the first semiconductor region.

13. The display device according to claim 12, wherein the channel formation region of the oxide semiconductor film comprises an intrinsic oxide semiconductor or a substantially intrinsic oxide semiconductor.

14. The display device according to claim 12, wherein an off-state current per unit channel width of the transistor is 1 [aA/μm] or less.

15. The display device according to claim 12, wherein the oxide semiconductor film includes indium, gallium, and zinc.

16. The display device according to claim 12, wherein the oxide semiconductor film comprises a microcrystalline portion.

17. A transistor comprising:
a gate electrode;
a gate insulating layer over the gate electrode;
an oxide semiconductor film over the gate insulating layer;

an oxide insulating layer over the oxide semiconductor film; and electrodes over the oxide semiconductor film and the oxide insulating layer;

wherein the oxide semiconductor film comprises a first semiconductor region and a second semiconductor region in the same film, wherein a resistance of the first semiconductor region is higher than a resistance of the second semiconductor region, wherein the first semiconductor region is a channel formation region which comprises a region of an oxygen-excess state, wherein the second semiconductor region comprises an oxygen deficiency, and wherein the oxide insulating layer is over and in contact with the first semiconductor region.

18. The transistor according to claim 17, further comprising a first electrode and a second electrode, wherein each of the first electrode and the second electrode is in contact with the second semiconductor region.

19. The transistor according to claim 17, wherein the channel formation region of the oxide semiconductor film comprises an intrinsic oxide semiconductor or a substantially intrinsic oxide semiconductor.

20. The transistor according to claim 17, wherein an off-state current per unit channel width of the transistor is 1 [aA/μm] or less.

21. A display device comprising:
a first signal line;
a second signal line adjacent to the first signal line;
a third signal line intersecting with the first signal line and the second signal line;
a transistor including a gate electrode, a gate insulating layer over the gate electrode, an oxide semiconductor layer over the gate insulating layer, an oxide insulating layer over the oxide semiconductor layer, and electrodes over the oxide semiconductor layer and the oxide insulating layer; and
a pixel electrode,
wherein the transistor is electrically connected to the first signal line, the third signal line and the pixel electrode,
wherein the pixel electrode overlaps with portions of the first signal line and the second signal line,
wherein a difference of an overlapping area between the pixel electrode and the first signal line and an overlapping area between the pixel electrode and the second signal line is within 10%,
wherein the oxide semiconductor layer comprises a first semiconductor region and a second semiconductor region in the same film,
wherein a resistance of the first semiconductor region is higher than a resistance of the second semiconductor region,
wherein the first semiconductor region is a channel formation region which comprises a region of an oxygen-excess state,
wherein the second semiconductor region comprises an oxygen deficiency, and
wherein the oxide insulating layer is over and in contact with the first semiconductor region.

22. The display device according to claim 21, wherein the difference is within 5%.

23. The display device according to claim 21, wherein the first signal line is a source signal line.

24. The display device according to claim 21, wherein the second signal line is a source signal line.

25. The display device according to claim 21, wherein the third signal line is a gate signal line.

26. The display device according to claim 21,
wherein the first signal line is a first source signal line,
wherein the second signal line is a second source signal line, and
wherein the third signal line is a gate signal line.

27. The display device according to claim 21, wherein the oxide semiconductor layer is intrinsic or substantially intrinsic.

28. The display device according to claim 21, wherein an off-state current of the transistor is 1 [aA/μm] or less.

29. The display device according to claim 21, wherein the oxide semiconductor layer includes indium, gallium, and zinc.

* * * * *